(12) United States Patent
Misaki

(10) Patent No.: US 10,868,082 B2
(45) Date of Patent: Dec. 15, 2020

(54) IMAGING PANEL AND METHOD FOR PRODUCING SAME

(71) Applicant: Sharp Kabushiki Kaisha, Sakai (JP)

(72) Inventor: Katsunori Misaki, Yonago (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 21 days.

(21) Appl. No.: 16/473,356

(22) PCT Filed: Dec. 22, 2017

(86) PCT No.: PCT/JP2017/046234
§ 371 (c)(1),
(2) Date: Jun. 25, 2019

(87) PCT Pub. No.: WO2018/123905
PCT Pub. Date: Jul. 5, 2018

(65) Prior Publication Data
US 2020/0127055 A1     Apr. 23, 2020

(30) Foreign Application Priority Data

Dec. 27, 2016   (JP) ................................. 2016-254415

(51) Int. Cl.
*G01N 23/20*     (2018.01)
*H01L 27/30*     (2006.01)
(Continued)

(52) U.S. Cl.
CPC ............ *H01L 27/308* (2013.01); *G01T 1/003* (2013.01); *G01T 1/2018* (2013.01); *H01L 29/786* (2013.01)

(58) Field of Classification Search
CPC .............. G01N 23/04; G01N 2223/505; G01T 1/2006; G01T 1/003; G01T 1/2002;
(Continued)

(56) References Cited

U.S. PATENT DOCUMENTS

| 8,440,977 | B2* | 5/2013 | Ishii ................. H01L 27/14663 250/370.08 |
| 10,580,818 | B2* | 3/2020 | Misaki ............. H01L 27/14612 |

(Continued)

FOREIGN PATENT DOCUMENTS

| JP | 2011-159781 A | 8/2011 |
| JP | 2013-46043 A | 3/2013 |

(Continued)

*Primary Examiner* — Irakli Kiknadze
(74) *Attorney, Agent, or Firm* — Keating & Bennett, LLP

(57) ABSTRACT

An imaging panel generates an image based on scintillation light that is obtained from X-rays transmitted through an object. The imaging panel includes, in a terminal area, a terminal-first insulating film that is made of the same material as that of a first insulating film on a TFT, and is separated on a part of a first conductive layer so as to have an opening; a terminal-semiconductor layer is provided above the terminal-first insulating film, and is made of the same material as that of at least a part of semiconductor layers of a photoelectric conversion layer; and a second conductive layer made of the same material as that of a conductive film connected with a photoelectric conversion element, is provided on the terminal-semiconductor layer so as to be in contact with the first conductive layer in the opening.

7 Claims, 25 Drawing Sheets

(51) Int. Cl.
*G01T 1/00* (2006.01)
*G01T 1/20* (2006.01)
*H01L 29/786* (2006.01)

(58) Field of Classification Search
CPC ......... G01T 1/2018; G01T 1/247; G01T 1/20; G01T 1/208; G01T 1/24; G01T 1/241; G01T 1/244; G01T 7/00; G01T 1/246; G01T 1/248; G01T 1/2928; H04N 5/374; H04N 5/32; H04N 5/321; H04N 5/369; H01L 27/14663; H01L 27/14692; H01L 27/144; H01L 27/146; H01L 27/14601; H01L 27/14603; H01L 27/14609; H01L 29/786; H01L 31/18; H01L 21/3205; H01L 21/768; H01L 23/522; H01L 27/1225; H01L 27/1259; H01L 27/308; H01L 27/14636; H01L 27/14658; H01L 2924/0002; H01L 27/14612; H01L 27/14659; H01L 27/14689; H01L 2924/00; H01L 31/0224; H01L 31/022408; H01L 21/76879; H01L 27/14638; H01L 27/14652; H01L 27/14676; H01L 27/14683; H01L 27/14632; G01J 5/20; A61B 6/4208; A61B 6/4233; A61B 6/00
USPC .................................................. 378/62, 98.8
See application file for complete search history.

(56) References Cited

U.S. PATENT DOCUMENTS

| | | | |
|---|---|---|---|
| 2011/0073750 A1* | 3/2011 | Nagano | H04N 5/32 250/208.1 |
| 2012/0228509 A1* | 9/2012 | Kusayama | G01T 1/2002 250/361 R |
| 2013/0048863 A1 | 2/2013 | Ohta et al. | |
| 2013/0206993 A1* | 8/2013 | Ibuki | G01T 1/2006 250/366 |
| 2014/0103347 A1 | 4/2014 | Ishino | |

FOREIGN PATENT DOCUMENTS

| | | |
|---|---|---|
| JP | 2014-078651 A | 5/2014 |
| JP | 2015-78651 A | 4/2015 |
| JP | 2015-119113 A | 6/2015 |

* cited by examiner

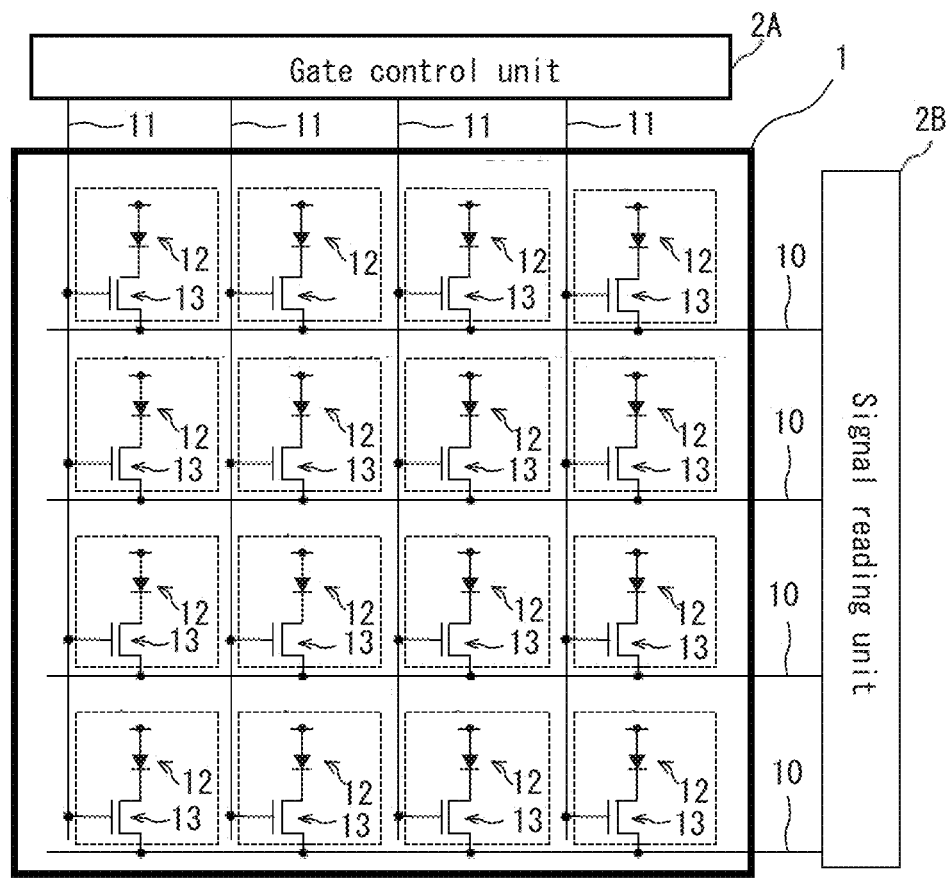
F I G. 2

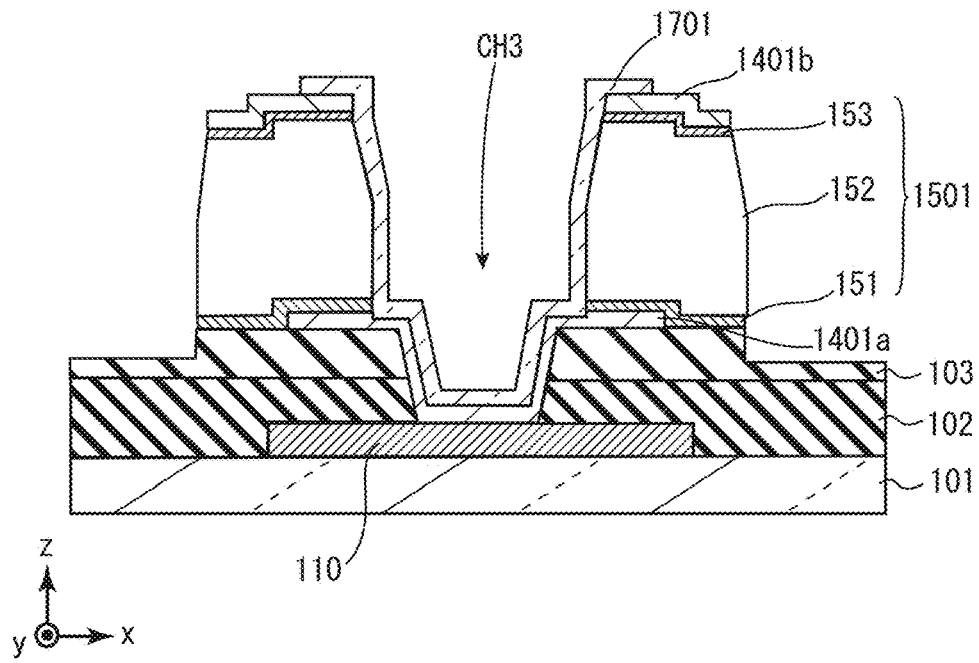
F I G. 5 A
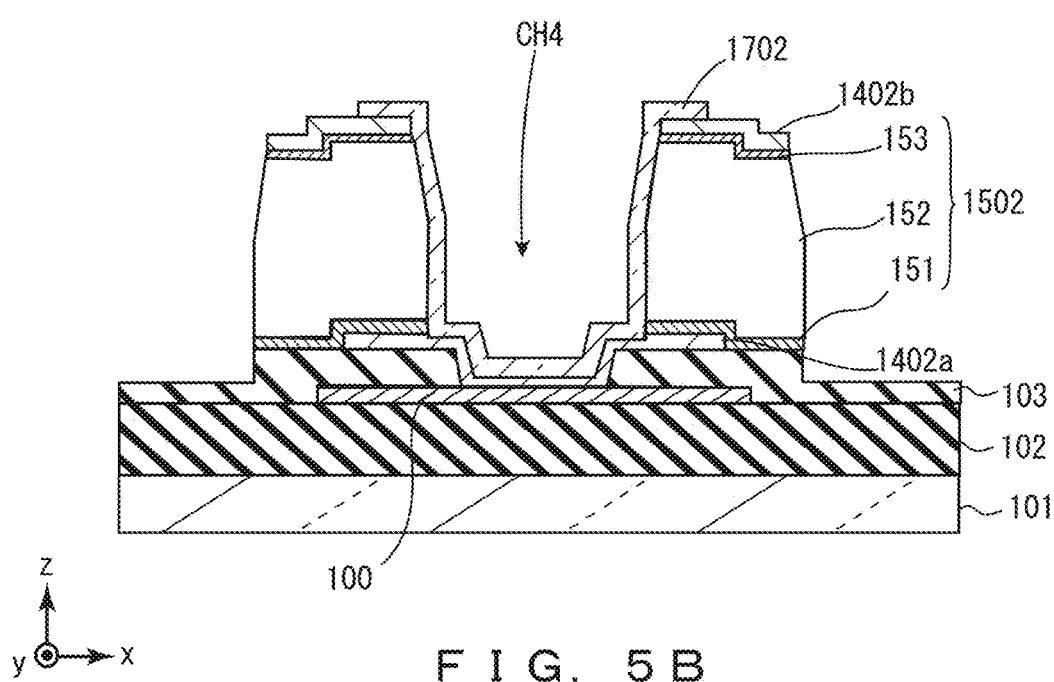
F I G. 5 B

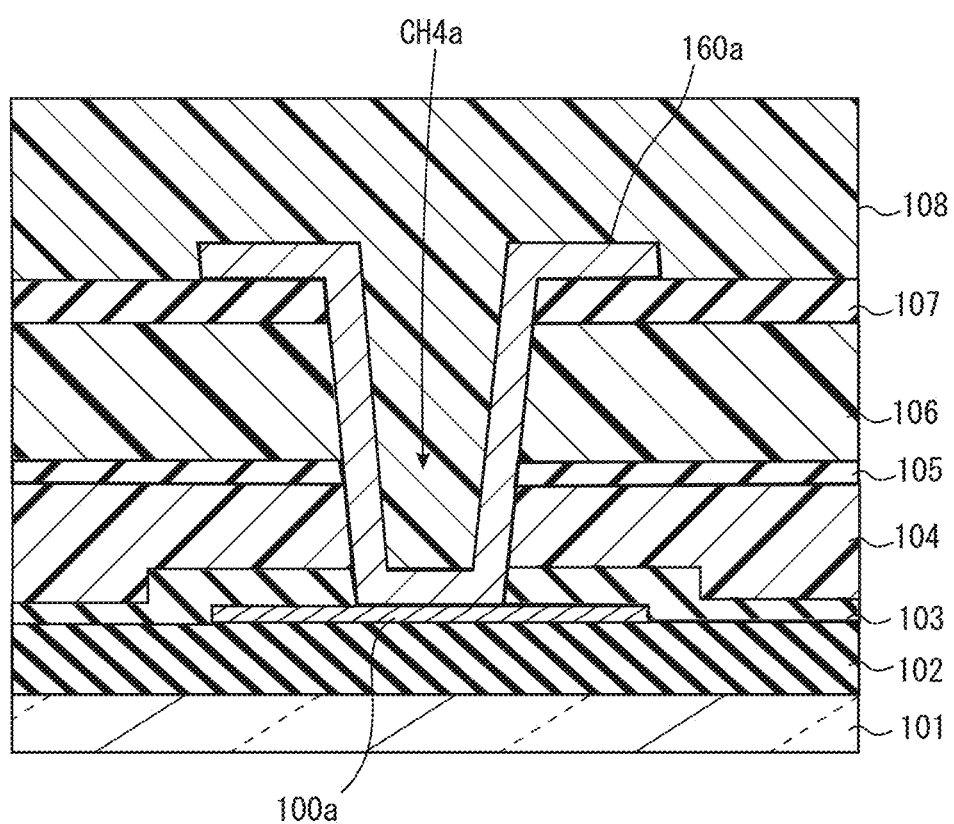
F I G. 5C

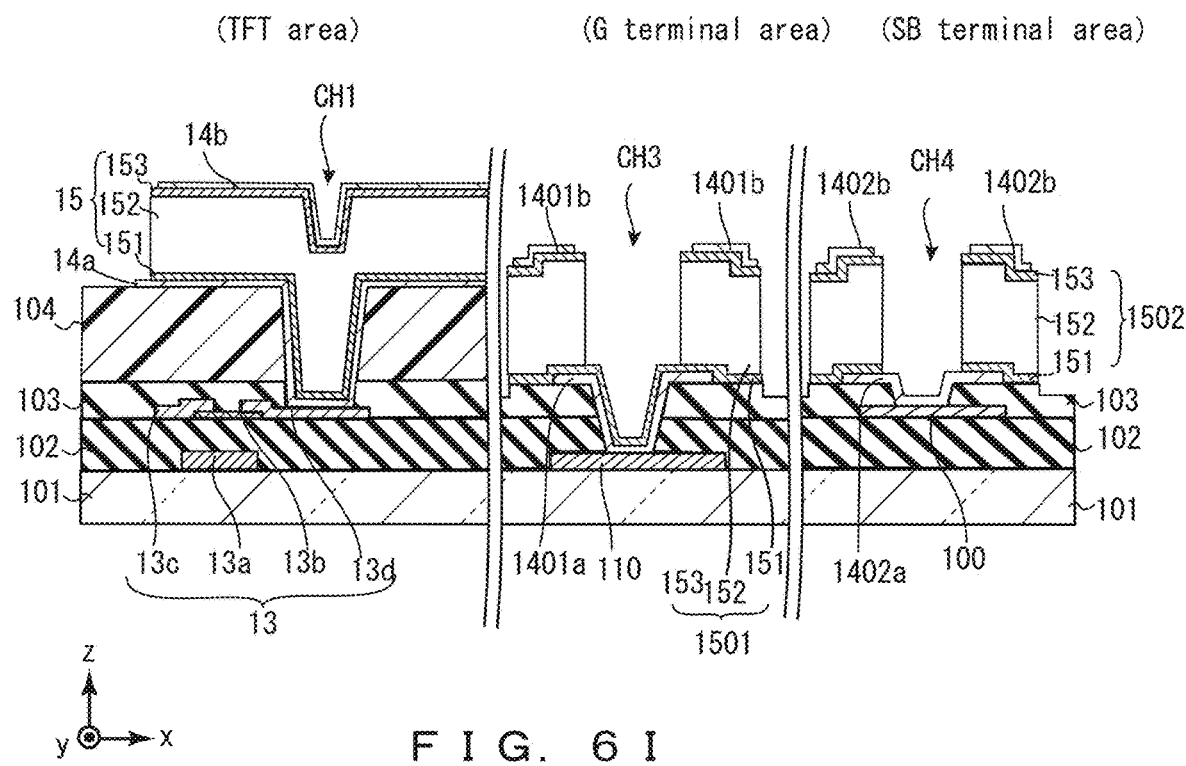
F I G. 6 I
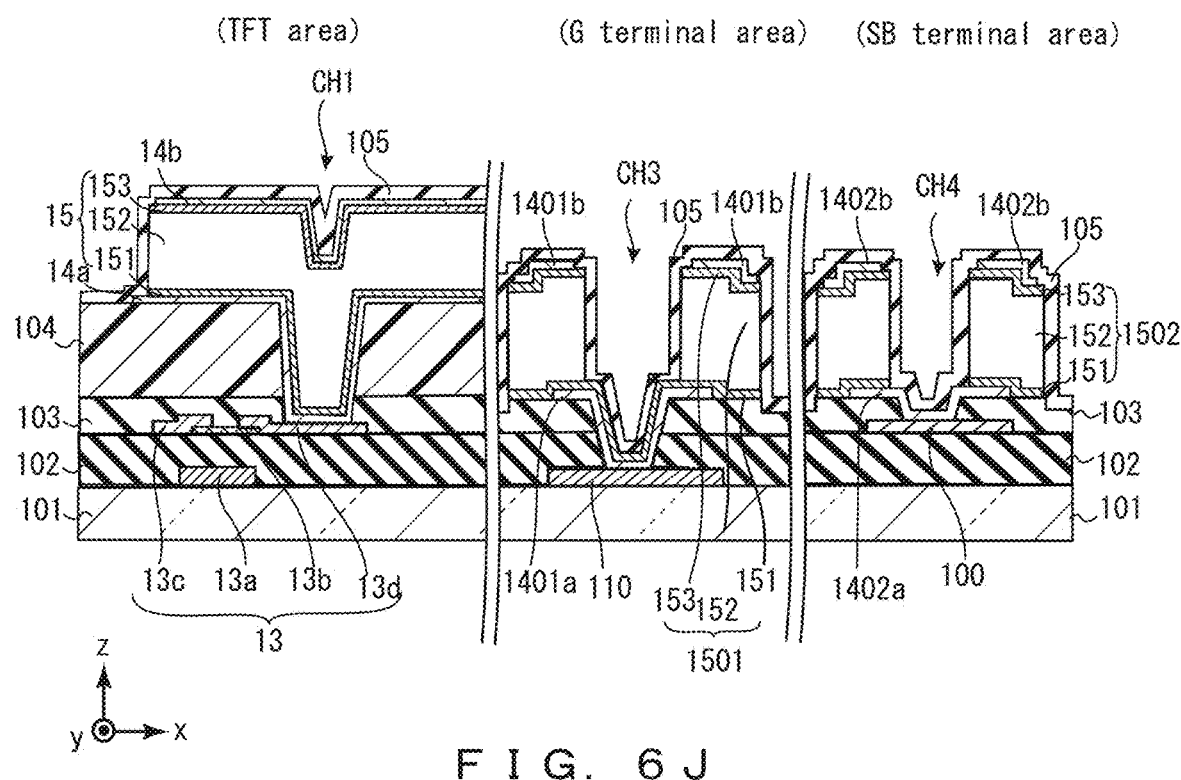
F I G. 6 J

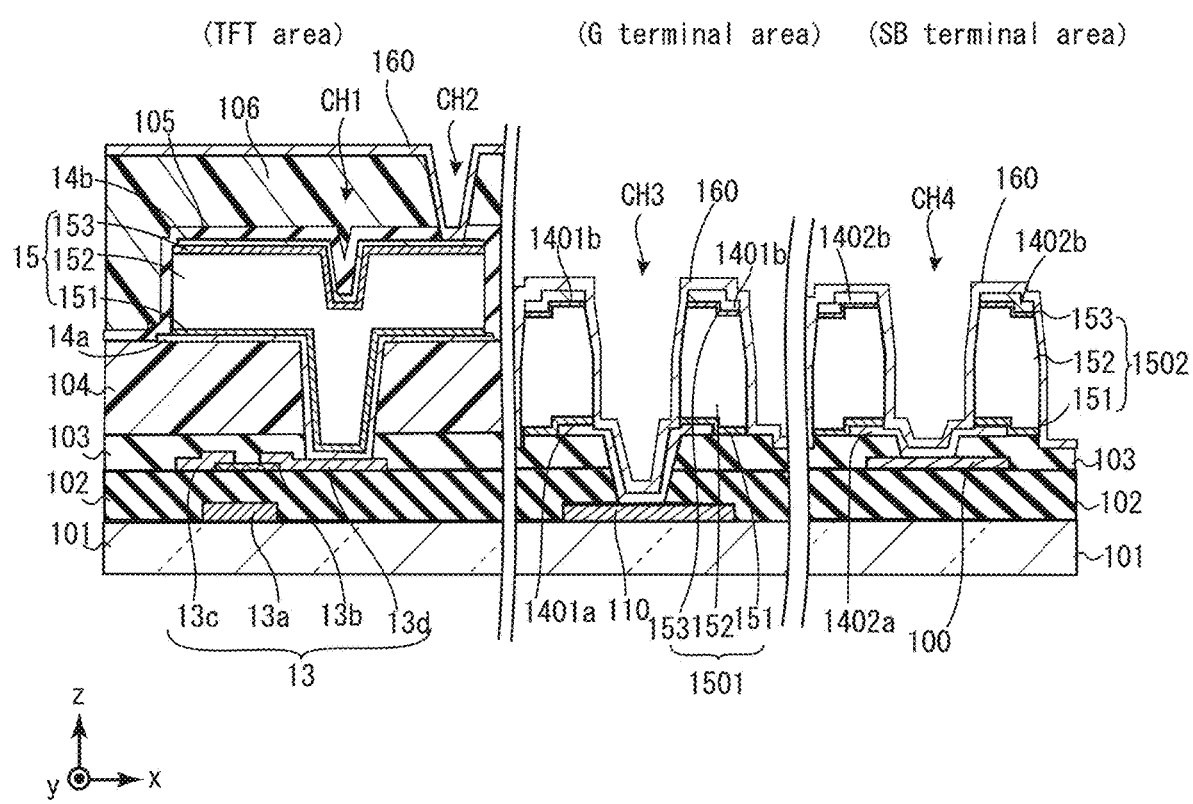
F I G. 6 N

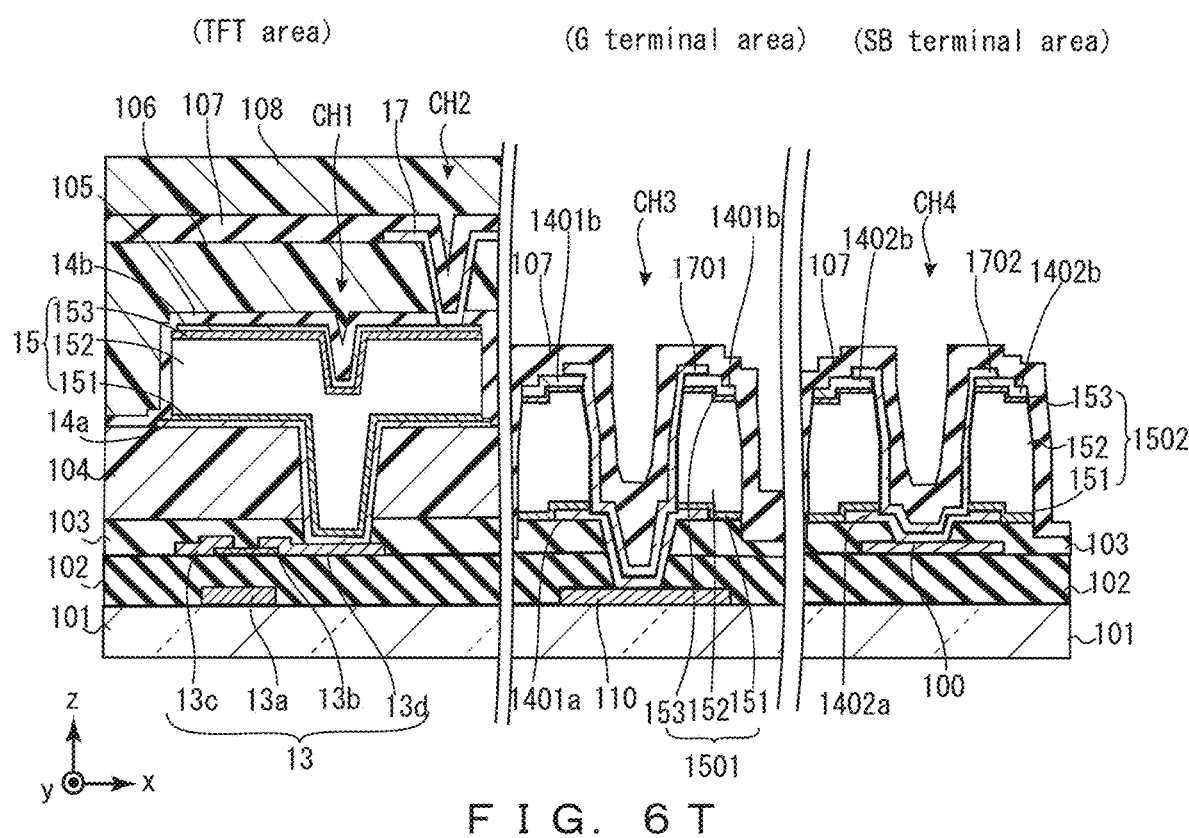
F I G. 6 T

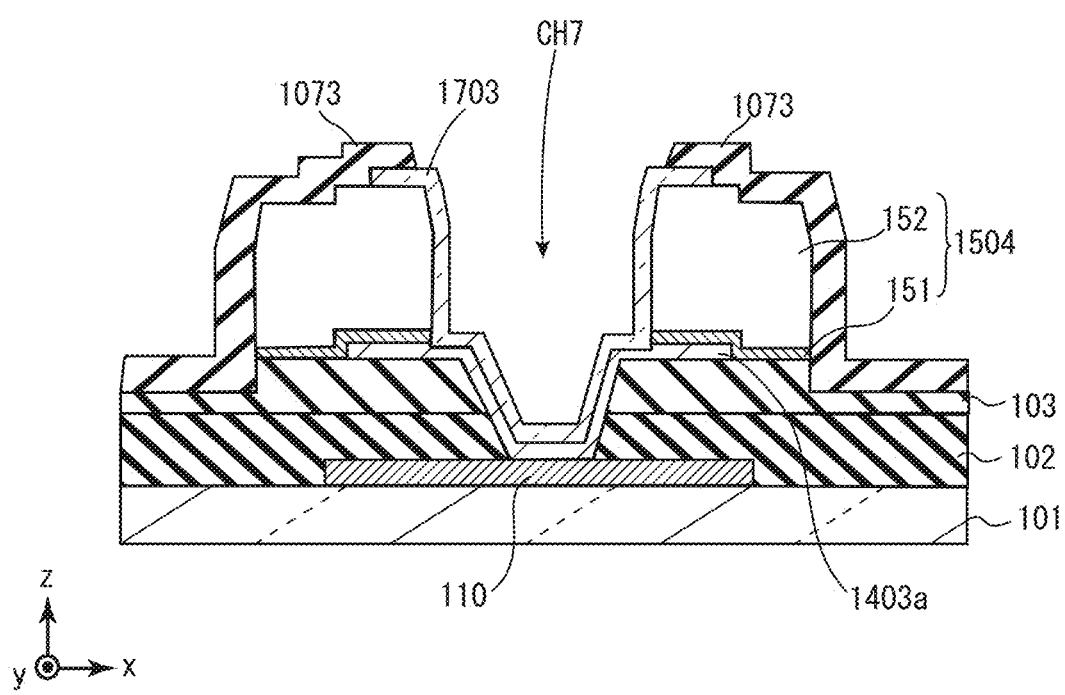
F I G. 1 1

IMAGING PANEL AND METHOD FOR PRODUCING SAME

TECHNICAL FIELD

The present invention relates to an imaging panel and a method for producing the same.

BACKGROUND ART

An X-ray imaging device that picks up an X-ray image with an imaging panel that includes a plurality of pixel portions is known. In such an X-ray imaging device, for example, irradiated X-rays are converted into charges by photodiodes. Thin film transistors (hereinafter also referred to as TFTs) provided in the pixel portions are operated to read out converted charges. With the charges being read out in this way, an X-ray image is obtained. JP-A-2013-46043 discloses such an imaging panel. The photodiode in the configuration disclosed in JP-A-2013-46043 has a PIN structure in which an n-type semiconductor layer, an i-type semiconductor layer, and a p-type semiconductor layer are laminated. On the photodiode, an upper electrode formed with a transparent conductive film is provided; and under the photodiode, a lower electrode containing a metal such as aluminum is provided.

SUMMARY OF THE INVENTION

Incidentally, outside an active area where TFTs and photodiodes are formed, terminals that are connected with gate electrodes and source electrodes of the TFTs are formed. The terminals are preferably formed by using the steps for forming the active area, so that they are formed simultaneously when the active area is formed. This allows the productivity of imaging panels to be improved, and the manufacturing costs to be reduced.

The disclosure relates to an X-ray imaging panel that allows the productivity to be improved and a method for producing the same.

An imaging panel of the present invention that achieves the above-described object is an imaging panel that generates an image based on scintillation light that is obtained from X-rays transmitted through an object, the imaging panel comprising a substrate having an active area and a terminal area, the imaging panel further comprising, in the active area: a thin film transistor formed on the substrate; a first insulating film provided on the thin film transistor; a photoelectric conversion element provided on the first insulating film, the photoelectric conversion element including a first semiconductor layer of a first conductive type, an intrinsic amorphous semiconductor layer, and a second semiconductor layer of a second conductive type that is opposite to the first conductive type, as a photoelectric conversion layer that converts the scintillation light into charges; a second insulating film separated in a layer above the photoelectric conversion element so as to have a contact hole; and a conductive film that is connected with the photoelectric conversion element through the contact hole, the imaging panel further comprising, in the terminal area: a first conductive layer provided on the substrate, the first conductive layer being made of the same material as that of a gate electrode or a source electrode of the thin film transistor; a terminal-first insulating film that is made of the same material as that of the first insulating film, and is separated on a part of the first conductive layer so as to have an opening; a terminal-semiconductor layer that is provided above the terminal-first insulating film, and is made of the same material as that of at least a part of the semiconductor layers of the photoelectric conversion layer; and a second conductive layer that is made of the same material as that of the conductive film, and is provided on the terminal-semiconductor layer so as to be in contact with the first conductive layer in the opening.

With the present invention, the productivity of the imaging panel can be improved.

BRIEF DESCRIPTION OF DRAWINGS

FIG. 2 is a schematic diagram showing a schematic configuration of the imaging panel shown in FIG. 1.

FIG. 5A is a cross-sectional view of the G terminal area shown in FIG. 4A, taken along line B-B.

FIG. 5B is a cross-sectional view of an SB terminal area shown in FIG. 4B, taken along line C-C.

FIG. 5C is a cross-sectional view of an S-B contact shown in FIG. 4B, taken along line D-D.

FIG. 6I is a cross-sectional view showing a step of forming a photoelectric conversion layer in the TFT area shown in FIG. 6H, and forming a semiconductor layer in the G terminal area and the SB terminal area shown therein.

FIG. 6J is a cross-sectional view showing a step of forming a third insulating film in the TFT area, the G terminal area and the SB terminal area shown FIG. 6I.

FIG. 6N is a cross-sectional view showing a step of forming a metal film in the TFT area, the G terminal area and the SB terminal area shown in FIG. 6M.

FIG. 6T is a cross-sectional view showing a step of patterning the sixth insulating film shown in FIG. 6S, and removing the sixth insulating film in the G terminal area and the SB terminal area.

FIG. 11 is a cross-sectional view showing a structure of a G terminal, an S terminal and a B terminal in a modification example of Embodiment 3.

MODE FOR CARRYING OUT THE INVENTION

Figure 1:
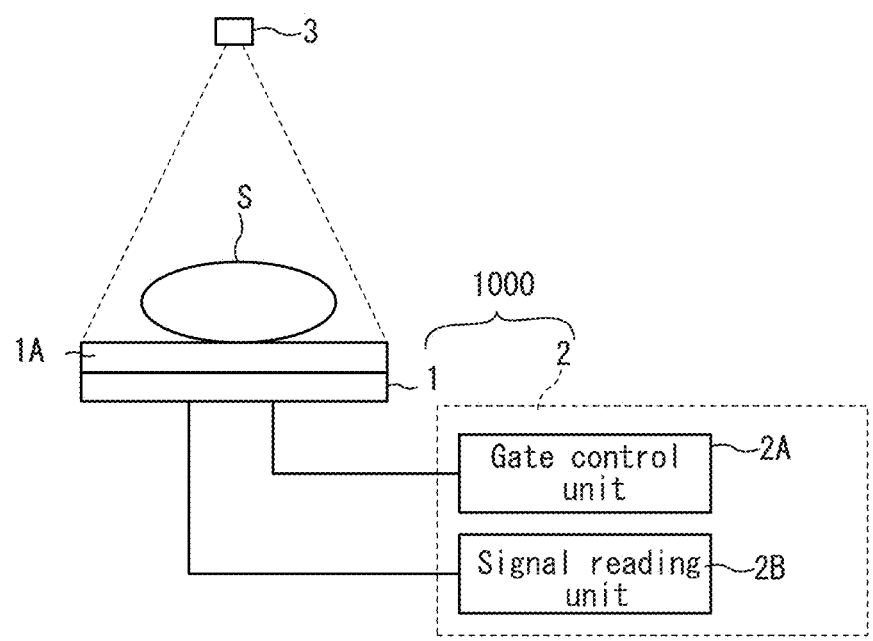
FIG. 1 is a schematic diagram of an X-ray imaging device in an embodiment.

An imaging panel according to an embodiment of the present invention is an imaging panel that generates an image based on scintillation light that is obtained from X-rays transmitted through an object, the imaging panel comprising a substrate having an active area and a terminal area, the imaging panel further comprising, in the active area: a thin film transistor formed on the substrate; a first insulating film provided on the thin film transistor; a photoelectric conversion element provided on the first insulating film, the photoelectric conversion element including a first semiconductor layer of a first conductive type, an intrinsic amorphous semiconductor layer, and a second semiconductor layer of a second conductive type that is opposite to the first conductive type, as a photoelectric conversion layer that converts the scintillation light into charges; a second insulating film separated in a layer above the photoelectric conversion element so as to have a contact hole; and a conductive film that is connected with the photoelectric conversion element through the contact hole, the imaging panel further comprising, in the terminal area: a first conductive layer provided on the substrate, the first conductive layer being made of the same material as that of a gate electrode or a source electrode of the thin film transistor; a terminal-first insulating film that is made of the same material as that of the first insulating film, and is separated on a part of the first conductive layer so as to have an opening; a terminal-semiconductor layer that is provided above the terminal-first insulating film, and is made of the same material as that of at least a part of the semiconductor layers of the photoelectric conversion layer; and a second conductive layer that is made of the same material as that of the conductive film, and is provided on the terminal-semiconductor layer so as to be in contact with the first conductive layer in the opening (the first configuration).

According to the first configuration, the imaging panel has an active area and a terminal area. In the terminal area, the imaging panel includes a terminal-first insulating film and a terminal-semiconductor layer on the first conductive layer, and a second conductive layer on the terminal-semiconductor layer, which the second conductive layer is in contact with the first conductive layer in the opening of the terminal-first insulating film. The first conductive layer is made of the same material as that of the gate electrode or the source electrode in the active area, and the terminal-first insulating film is formed with the same material as that of the first insulating film in the active area. Further, the terminal-semiconductor layer is formed with the same material as that of at least a part of the photoelectric conversion layer in the active area. The second conductive layer is formed with the same material as that of the conductive film in the active area.

In a case where the active area and the terminal area are produced in parallel, it is efficient if the terminal area is produced by using a step of forming the active area terminal area, without using a step exclusively for the terminal area. In the producing process, for example, the second insulating film provided in an upper layer with respect to the photoelectric conversion layer in the active area is formed also on the terminal-semiconductor layer in the terminal area, and the second insulating film is etched when the contact hole of the second insulating film is formed in the active area. In a case where a terminal-semiconductor layer is not provided in the terminal area, the etching of the second insulating film possibly causes the first conductive layer and the terminal-first insulating film to be simultaneously etched. In the present configuration, even if the second insulating film is etched, the terminal-semiconductor layer thus provided makes it possible to protect the first conductive layer and the terminal-first insulating film covered with the terminal-semiconductor layer. In the present configuration, therefore, the terminal area can be produced by using the step of producing the active area, without increasing steps to produce the terminal area as compared with a case where any semiconductor layer is not provided in the terminal area.

The first configuration may be further characterized in that the photoelectric conversion element includes a lower electrode provided under the photoelectric conversion layer, and an upper electrode provided on the photoelectric conversion layer, and the conductive film is connected with the upper electrode, the imaging panel further comprising, in the terminal area, an upper electrode layer that is provided on the terminal-semiconductor layer, and is made of the same material as that of the upper electrode in contact with the second conductive layer (the second configuration).

According to the second configuration, the imaging panel includes the upper electrode layer on the terminal-semiconductor layer in the terminal area, which makes it possible to further reduce influences when the second insulating film is etched, as compared with a case where no upper electrode layer is provided.

The second configuration may be further characterized in further including, in the terminal area, a lower electrode layer that is made of the same material as that of the lower electrode, is provided under the terminal-semiconductor layer, and is in contact with the first conductive layer and the second conductive layer in the opening (the third configuration).

According to the third configuration, the imaging panel includes the lower electrode layer under the terminal-semiconductor layer in the terminal area, which makes it possible to further reduce influences when the second insulating film is etched, as compared with a case where no lower electrode layer is provided.

The second or third configuration may be further characterized in that a lateral side end of the upper electrode layer is arranged inside with respect to a lateral side end of the semiconductor layer (the fourth configuration).

With the fourth configuration, the second conductive layer can be arranged along side surfaces of the upper electrode layer and the semiconductor layer in the opening, as compared with a case where the lateral side end of the upper electrode layer is arranged outside with respect to the lateral side end of the semiconductor layer. As a result, it is possible to prevent the second conductive layer from having disconnection.

The fourth configuration may be further characterized in that the semiconductor layer has such a tapered shape that a bottom of the semiconductor layer is arranged outside with respect to an upper part of the semiconductor layer (the fifth configuration).

With the fifth configuration, the second conductive layer can be arranged along a side surface of the semiconductor layer in the opening, as compared with a case of such an inversely tapered shape that the upper part of the semiconductor layer is arranged inside with respect to the bottom part thereof. As a result, it is possible to prevent the second conductive layer from having disconnection.

Any one of the first to fifth configurations may be further characterized in further including, in the active area, a third insulating film that is provided on the second insulating film and covers the conductive film; and in the terminal area, a terminal-second insulating film that is made of the same material as that of the third insulating film, and in an area excluding the opening, covers at least a part of the terminal-first insulating film and the terminal-semiconductor layer (the sixth configuration).

According to the sixth configuration, the terminal area further includes the terminal second insulating film, which causes the thickness in the terminal area to increase, as compared with a case where no terminal second insulating film is provided. As a result, the reliability in the terminal area is improved.

A method for producing an imaging panel according to one embodiment of the present invention is a method for producing an imaging panel that generates an image based on scintillation light that is obtained from X-rays transmitted through an object, the method comprising the steps of: forming a thin film transistor in an active area on a substrate, and at the same time, forming a first conductive layer made of the same material as that of a gate electrode or a source electrode of the thin film transistor, in a terminal area on the substrate; forming a first insulating film on the thin film transistor, and at the same time, forming a terminal-first insulating film that is made of the same material as that of the first insulating film, and is arranged so as to have an opening on a part of the first conductive layer; forming, on the drain electrode of the thin film transistor, a first contact hole passing through the first insulating film, and forming, on the first insulating film, a lower electrode that is connected with the drain electrode through the first contact hole; forming, on the lower electrode, a photoelectric conversion layer composed of a first semiconductor layer of a first conductive type, an intrinsic amorphous semiconductor layer, and a second semiconductor layer of a second conductive type that is opposite to the first conductive type, forming an upper electrode on the photoelectric conversion layer, and at the same time, forming, above the terminal-first insulating film, in an area excluding the opening, a terminal-semiconductor layer that is made of the same material as that of at least a part of the semiconductor layers in the photoelectric conversion layer; forming a second insulating film on the upper electrode and the terminal-semiconductor layer, and forming a resin layer on the second insulating film in the active area, the resin layer having an opening on the upper electrode; forming a second contact hole that passes through the second insulating film at a position where the opening of the resin layer is provided, by using the resin layer in the active area as a mask, and at the same time, removing the second insulating film provided on the terminal-semiconductor layer; and forming a conductive film in on the resin layer in the active area so that the conductive film is connected with the upper electrode through the second contact hole, and at the same time, forming, on the terminal-semiconductor layer, a second conductive film that is made of the same material as that of the conductive film so that the second conductive film is in contact with the first conductive film at the opening (the first producing method).

According to the first producing method, the second insulating film provided in an upper layer with respect to the photoelectric conversion layer in the active area is formed also on the terminal-semiconductor layer in the terminal area, and when the contact hole of the second insulating film in the active area is formed, the second insulating film is etched by using the resin layer in the active area as a mask, while the second insulating film in the terminal area is also simultaneously etched. In a case where no terminal-semiconductor layer is provided in the terminal area, the etching of the second insulating film possibly causes the first conductive layer and the terminal-first insulating film to be etched. In this case, therefore, the second insulating film and the resin layer have to be etched separately so as to form a contact hole. In contrast, in the case of the present configuration, even if the second insulating film is etched, the terminal-semiconductor layer thus provided makes it possible to protect the first conductive layer and the terminal-first insulating film covered with the terminal-semiconductor layer. The terminal area therefore can be produced by using the step of producing the active area, without increasing the number of steps of producing the terminal area.

The following description describes embodiments of the present invention in detail, while referring to the drawings. Identical or equivalent parts in the drawings are denoted by the same reference numerals, and the descriptions of the same are not repeated.

Embodiment 1

(Configuration)

FIG. 1 is a schematic diagram showing an X-ray imaging device in the present embodiment. The X-ray imaging device 1000 includes an imaging panel 1 and a control unit 2. The control unit 2 includes a gate control unit 2A and a signal reading unit 2B. X-rays are irradiated from the X-ray source 3 to an object S, and X-rays transmitted through the object S are converted into fluorescence (hereinafter referred to as scintillation light) by a scintillator 1A provided above the imaging panel 1. The X-ray imaging device 1000 acquires an X-ray image by picking up the scintillation light with the imaging panel 1 and the control unit 2.

FIG. 2 is a schematic diagram showing a schematic configuration of the imaging panel 1. As shown in FIG. 2, a plurality of source lines 10, and a plurality of gate lines 11 intersecting with the source lines 10 are formed in the imaging panel 1. The gate lines 11 are connected with the gate control unit 2A, and the source lines 10 are connected with the signal reading unit 2B.

The imaging panel 1 includes TFTs 13 connected to the source lines 10 and the gate lines 11, at positions at which the source lines 10 and the gate lines 11 intersect. Further, photodiodes 12 are provided in areas surrounded by the source lines 10 and the gate lines 11 (hereinafter referred to as pixels). In each pixel, scintillation light obtained by converting X-rays transmitted through the object S is converted by the photodiode 12 into charges according to the amount of the light.

The gate lines 11 in the imaging panel 1 are sequentially switched by the gate control unit 2A into a selected state, and the TFT 13 connected to the gate line 11 in the selected state is turned ON. When the TFT 13 is turned ON, a signal according to the charges obtained by the conversion by the photodiode 12 is output through the source line 10 to the signal reading unit 2B.

Figure 3A:
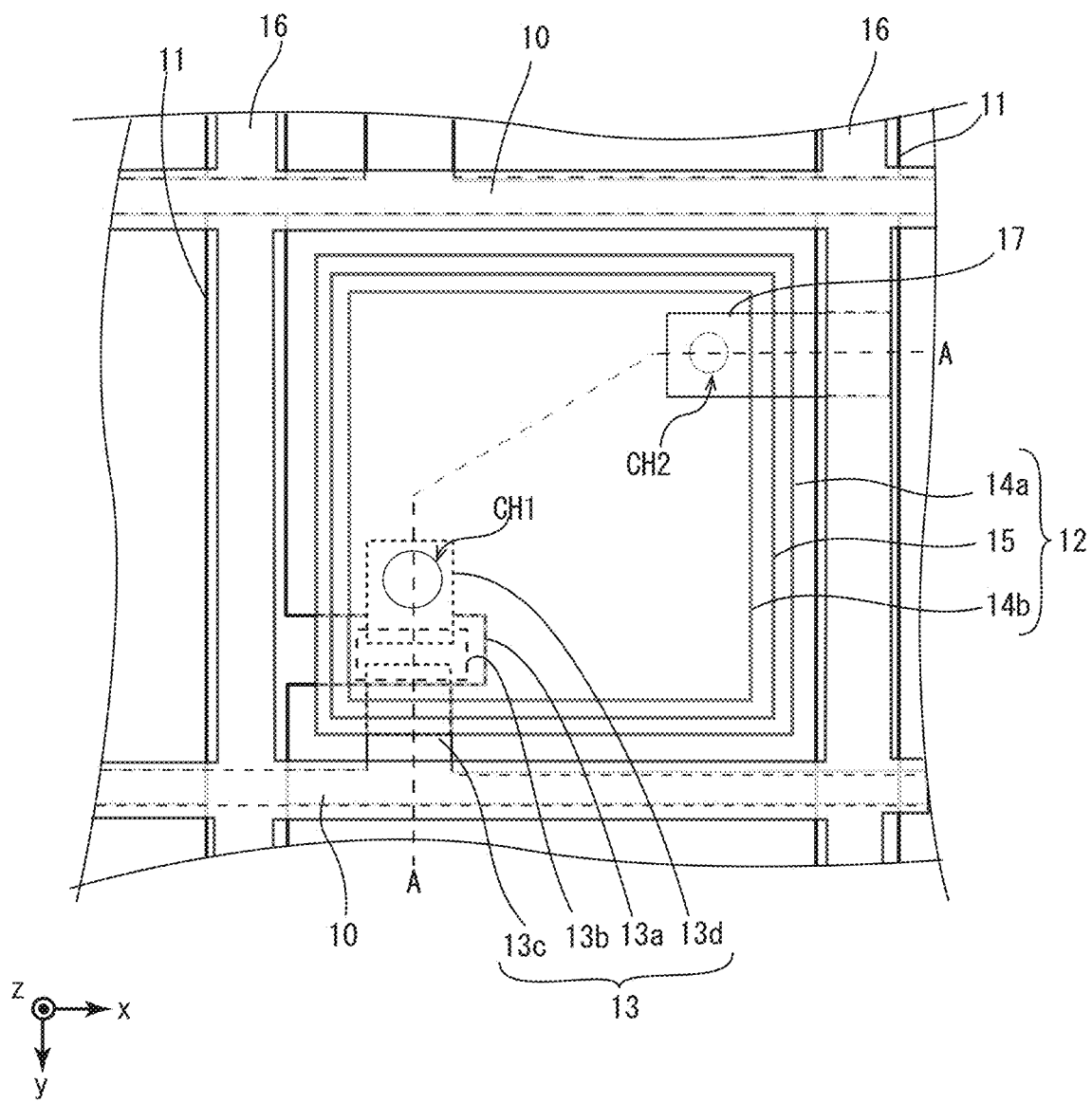
FIG. 3A is a schematic plan view of showing one pixel portion of the imaging panel shown in FIG. 2.

FIG. 3A is an enlarged plan view of one pixel portion of the imaging panel 1 shown in FIG. 2. As shown in FIG. 3A, in the pixel surrounded by the gate lines 11 and the source lines 10, a lower electrode 14a, a photoelectric conversion layer 15, and an upper electrode 14b that compose the photodiode 12 are arranged so as to overlap with one another. Further, a bias line 16 is arranged so as to overlap with the gate line 11 and the source line 10 when viewed in a plan view. The bias line 16 supplies a bias voltage to the photodiode 12. The TFT 13 includes a gate electrode 13a integrated with the gate line 11, a semiconductor active layer 13b, a source electrode 13c integrated with the source line 10, and a drain electrode 13d. In the pixel, a contact hole CH1 for connecting the drain electrode 13d and the lower electrode 14a with each other is provided. Further, in the pixel, a transparent conductive film 17 is provided so as to overlap with the bias line 16, and a contact hole CH2 for connecting the transparent conductive film 17 and the upper electrode 14b with each other is provided.

Figure 3B:
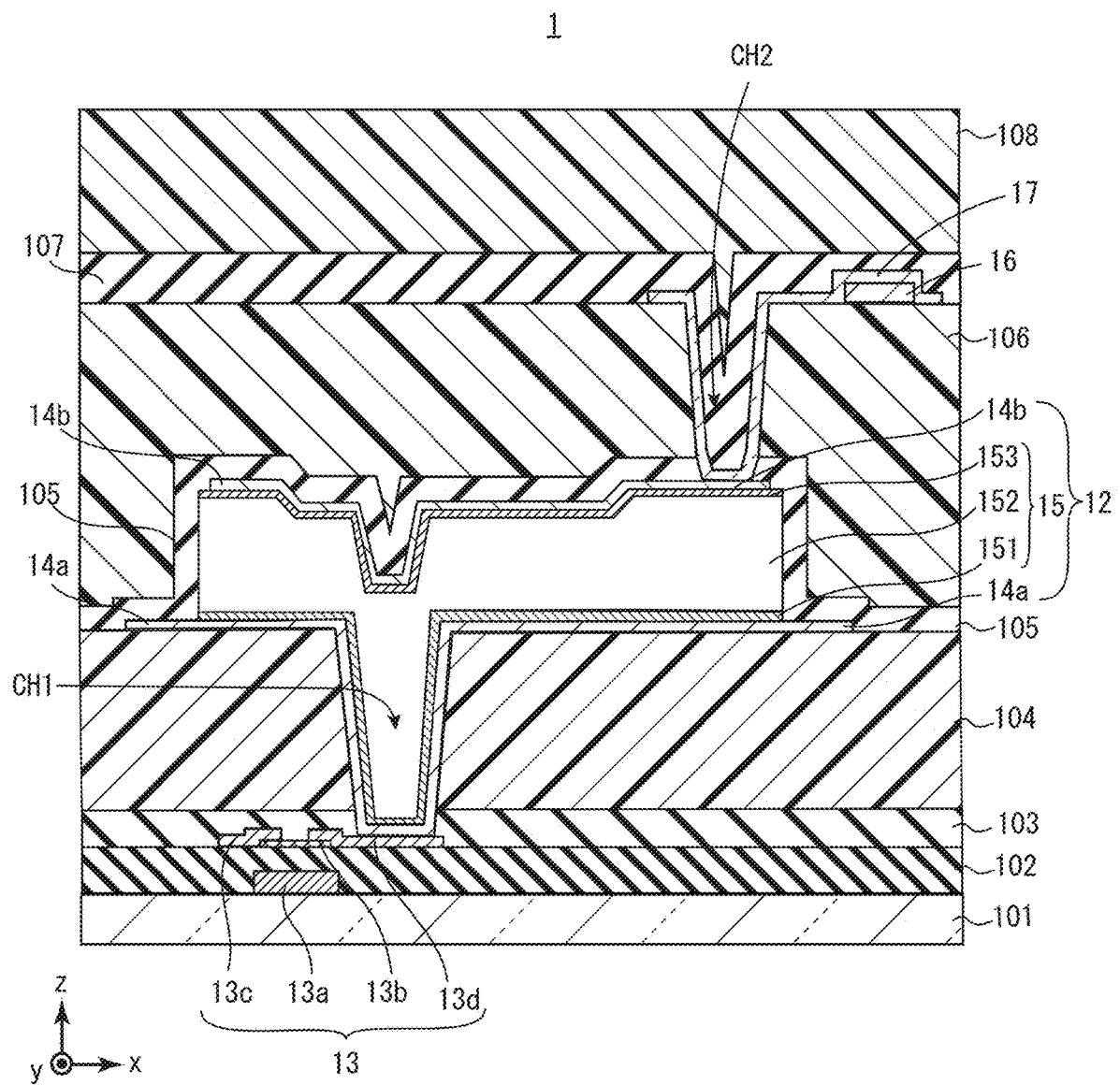
FIG. 3B is a cross-sectional view of the pixel shown in FIG. 3A, taken along the line A-A.

Here, FIG. 3B illustrates a cross section of the pixel shown in FIG. 3A, taken along a line A-A. As shown in FIG. 3B, the TFT 13 is formed on the substrate 101. The substrate 101 is a substrate having insulating properties, for example, a glass substrate, a silicon substrate, a plastic substrate having heat-resisting properties, a resin substrate, or the like.

Further, on the substrate 101, the gate electrode 13a integrated with the gate line 11 is formed. The gate electrode 13a and the gate line 11 are made of, for example, a metal such as aluminum (Al), tungsten (W), molybdenum (Mo), molybdenum nitride (MoN), tantalum (Ta), chromium (Cr), titanium (Ti), or copper (Cu), an alloy of any of these metals, or a metal nitride of these metals. In the present embodiment, the gate electrode 13a and the gate line 11 have a laminate structure in which a metal film made of molybdenum nitride and a metal film made of aluminum are laminated in this order. Regarding thicknesses of these metal films, for example, the metal film made of molybdenum nitride has a thickness of 100 nm, and the metal film made of aluminum has a thickness of 300 nm.

A gate insulating film 102 is provided on the substrate 101, and covers the gate electrode 13a. The gate insulating film 102 may be formed with, for example, silicon oxide ($SiO_x$), silicon nitride ($SiN_x$), silicon oxide nitride ($SiO_xN_y$) (x>y), or silicon nitride oxide ($SiN_xO_y$) (x>y). In the present embodiment, the gate insulating film 102 is formed with a laminate film obtained by laminating silicon oxide ($SiO_x$) and silicon nitride ($SiN_x$) in the order, and regarding the thicknesses of these films, the film of silicon oxide ($SiO_x$) has a thickness of 50 nm, and the film of silicon nitride ($SiN_x$) has a thickness of 400 nm.

The semiconductor active layer 13b, as well as the source electrode 13c and the drain electrode 13d connected with the semiconductor active layer 13b are formed on the gate electrode 13a with the gate insulating film 102 being interposed therebetween.

The semiconductor active layer 13b is formed in contact with the gate insulating film 102. The semiconductor active layer 13b is made of an oxide semiconductor. For forming the oxide semiconductor, for example, the following material may be used: $InGaO_3(ZnO)_5$; magnesium zinc oxide ($Mg_xZn_{1-x}O$); cadmium zinc oxide ($Cd_xZn_{1-x}O$); cadmium oxide (CdO); InSnZnO (containing indium (In), tin (Sn), and zinc (Zn)); material based on indium (In)-aluminum (Al)-zinc (Zn)-oxygen (O); or an amorphous oxide semiconductor containing indium (In), gallium (Ga), and zinc (Zn) at a predetermined ratio. Further, as an oxide semiconductor, "amorphous" materials, and "crystalline" materials (including polycrystalline materials, microcrystalline materials, and c-axis alignment crystalline materials) are applicable. In the case of the laminate structure, any combination is applicable (any particular combination is not excluded). In the present embodiment, the semiconductor active layer 13b is made of an amorphous oxide semiconductor containing indium (In), gallium (Ga), and zinc (Zn) at a predetermined ratio, and has a thickness of, for example, 70 nm. By applying a semiconductor active layer 13b, and an oxide semiconductor containing indium (In), gallium (Ga), zinc (Zn), and oxygen (O), off-leakage current of the TFT 13 can be reduced, as compared with amorphous silicon (a-Si). When off-leakage current of the TFT 13 is small, off-leakage current of the photoelectric conversion layer 15 is reduced, whereby quantum efficiency (QE) of the photoelectric conversion layer 15 is improved, which results in that the X-ray detection sensitivity can be improved.

The source electrode 13*c* and the drain electrode 13*d* are formed in contact with the semiconductor active layer 13*b* and the gate insulating film 102. The source electrode 13*c* is integrated with the source line 10. The drain electrode 13*d* is connected with the lower electrode 14*a* through the contact hole CH1.

The source electrode 13*c* and the drain electrode 13*d* are formed in the same layer, and are made of, for example, a metal such as aluminum (Al), tungsten (W), molybdenum (Mo), tantalum (Ta), chromium (Cr), titanium (Ti), or copper (Cu), or alternatively, an alloy of any of these, or a metal nitride of any of these. Further, as the material for the source electrode 13*c* and the drain electrode 13*d*, the following material may be used: a material having translucency such as indium tin oxide (ITO), indium zinc oxide (IZO), indium tin oxide (ITSO) containing silicon oxide, indium oxide ($In_2O_3$), tin oxide ($SnO_2$), zinc oxide (ZnO), or titanium nitride; or a material obtained by appropriately combining any of these.

The source electrode 13*c* and the drain electrode 13*d* may be, for example, a laminate of a plurality of metal films. More specifically, the source electrode 13*c*, the source line 10, and the drain electrode 13*d* have a laminate structure in which a metal film made of molybdenum nitride (MoN), a metal film made of aluminum (Al), and a metal film made of molybdenum nitride (MoN) are laminated in this order. Regarding the thicknesses of the films, the metal film in the lower layer, which is made of molybdenum nitride (MoN), has a thickness of 100 nm, the metal film made of aluminum (Al) has a thickness of 500 nm, and the metal film in the upper layer, which is made of molybdenum nitride (MoN), has a thickness of 50 nm.

A first insulating film 103 is provided so as to cover the source electrode 13*c* and the drain electrode 13*d*. The first insulating film 103 may have a single layer structure made of silicon oxide ($SiO_2$) or silicon nitride (SiN), or a laminate structure obtained by laminating silicon nitride (SiN) and silicon oxide ($SiO_2$) in this order.

On the first insulating film 103, a second insulating film 104 is formed. The second insulating film 104 is made of an organic transparent resin, for example, acrylic resin or siloxane-based resin, and has a thickness of, for example, 2.5 pmn.

On the drain electrode 13*d*, the contact hole CH1, passing through the second insulating film 104 and the first insulating film 103, is formed.

The lower electrode 14*a*, which is connected with the drain electrode 13*d* through the contact hole CH1, is formed on the second insulating film 104. The lower electrode 14*a* is formed with, for example, molybdenum (Mo), or a metal film obtained by laminating molybdenum (Mo) and indium tin oxide (ITO) in this order. In a case where the lower electrode 14*a* is made of molybdenum (Mo) alone, it has a thickness of, for example, 200 nm. Further, in a case where the lower electrode 14*a* is made of molybdenum (Mo) and indium tin oxide (ITO), the lower layer thereof made of molybdenum has a thickness of, for example, 200 nm, and the upper layer thereof made of ITO has a thickness of, for example, 70 nm.

Further, the photoelectric conversion layer 15, whose width in X-axis direction is smaller than that of the lower electrode 14*a*, is formed on the lower electrode 14*a*. The photoelectric conversion layer 15 has a PIN structure that is obtained by laminating an n-type amorphous semiconductor layer 151, an intrinsic amorphous semiconductor layer 152, and a p-type amorphous semiconductor layer 153 in the order.

The n-type amorphous semiconductor layer 151 is made of amorphous silicon doped with an n-type impurity (for example, phosphorus). The n-type amorphous semiconductor layer 151 has a thickness of, for example, 30 nm.

The intrinsic amorphous semiconductor layer 152 is made of intrinsic amorphous silicon. The intrinsic amorphous semiconductor layer 152 is formed in contact with the n-type amorphous semiconductor layer 151. The intrinsic amorphous semiconductor layer has a thickness of, for example, 1000 nm.

The p-type amorphous semiconductor layer 153 is made of amorphous silicon doped with a p-type impurity (for example, boron). The p-type amorphous semiconductor layer 153 is formed in contact with the intrinsic amorphous semiconductor layer 152. The p-type amorphous semiconductor layer 153 has a thickness of, for example, 5 nm.

On the p-type amorphous semiconductor layer 153, the upper electrode 14*b* is formed. The upper electrode 14*b* has a smaller width in the X-axis direction than that of the photoelectric conversion layer 15. The upper electrode 14*b* is made of, for example, indium tin oxide (ITO), and has a thickness of, for example, 70 nm.

A third insulating film 105 is formed so as to cover the photodiode 12. The third insulating film 105 is, for example, an inorganic insulating film made of silicon nitride (SiN), and has a thickness of, for example, 300 nm.

In the third insulating film 105, a contact hole CH2 is formed at such a position that the contact hole CH2 overlaps with the upper electrode 14*b*. On the third insulating film 105, in an area thereof except for the contact hole CH2, a fourth insulating film 106 is formed. The fourth insulating film 106 is formed with an organic transparent resin made of, for example, acrylic resin or siloxane-based resin, and has a thickness of, for example, 2.5 µm.

On the fourth insulating film 106, the bias line 16 is formed. Further, on the fourth insulating film 106, the transparent conductive film 17 is formed so as to overlap with the bias line 16. The transparent conductive film 17 is in contact with the upper electrode 14*b* at the contact hole CH2. The bias line 16 is connected to the control unit 2 (see FIG. 1). The bias line 16 applies a bias voltage through the contact hole CH2 to the upper electrode 14*b*, the bias voltage being input from the control unit 2. The bias line 16 has a laminate structure that is obtained by laminating, for example, a metal film made of molybdenum nitride (MoN), a metal film made of aluminum (Al), and a metal film made of titanium (Ti) in this order. The films of molybdenum nitride (MoN), aluminum (Al), and titanium (Ti) have thicknesses of, for example, 100 nm, 300 nm, and 50 nm, respectively.

On the fourth insulating film 106, a fifth insulating film 107 is formed so as to cover the transparent conductive film 17. The fifth insulating film 107 is an inorganic insulating film made of, for example, silicon nitride (SiN), and has a thickness of, for example, 200 nm.

On the fifth insulating film 107, a sixth insulating film 108 is formed. The sixth insulating film 108 is made of, for example, an organic transparent resin such as acrylic resin or siloxane-based resin, and has a thickness of, for example, 2.0 µm.

Figure 4A:
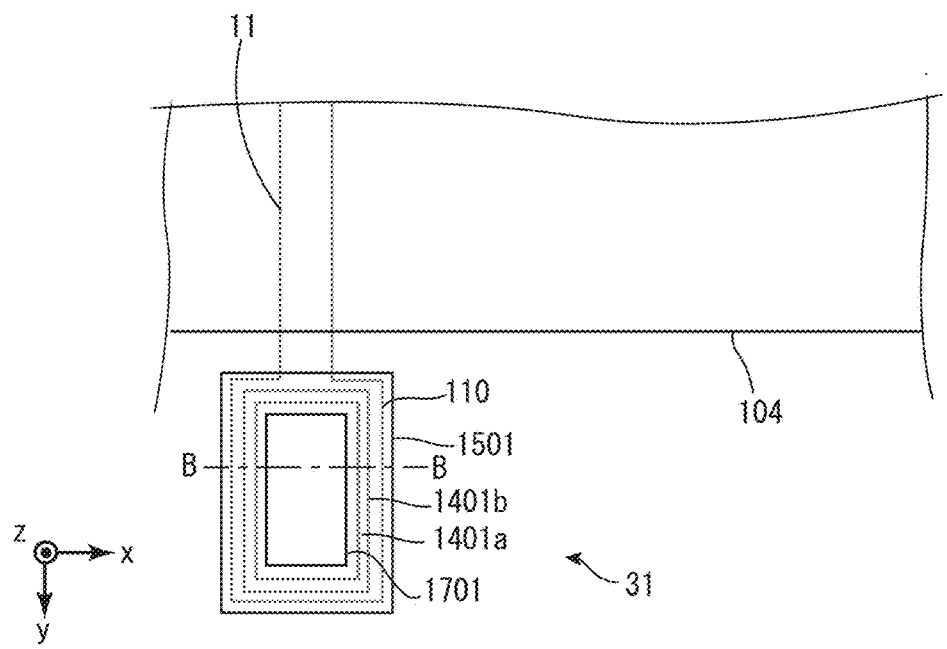
FIG. 4A is a schematic plan view of showing a G terminal area in the imaging panel shown in FIG. 1.
Figure 4B:
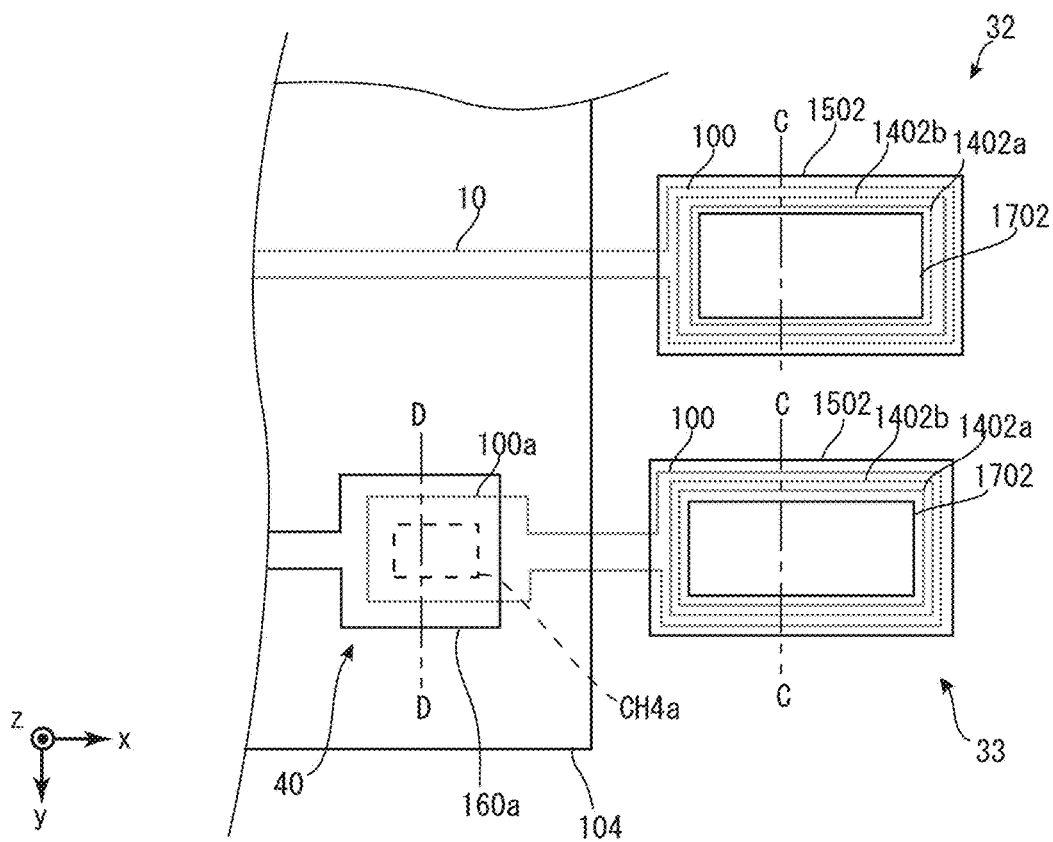
FIG. 4B is a schematic plan view showing of an SB terminal area in the imaging panel shown in FIG. 1.

FIGS. 4A and 4B are enlarged plan views of a part of an area outside the pixel region (hereinafter referred to as an "active area") of the imaging panel 1. FIG. 4A illustrates a G terminal area where a terminal 31 for connecting the gate electrode 13a and the gate line 11 shown in FIG. 3A with the gate control unit 2A (see FIG. 1) hereinafter, this terminal is referred to as a "G terminal") is provided.

FIG. 4B illustrates the following areas: an SB terminal area where a terminal (hereinafter referred to as an "S terminal") 32 for connecting the source electrode 31c and the source line 10 shown in FIG. 3A with the signal reading part 2B (see FIG. 1), a terminal (hereinafter referred to as a "B terminal") 33 for connecting the bias line 16 shown in FIG. 3A with the control unit 2 are provided; and an area where a contact (hereinafter referred to as an "S-B contact") for connecting the B terminal 33 with the bias line 16 is provided.

As shown in FIGS. 4A and 4B, the G terminal area and the SB terminal area are provided outside with respect to the second insulating film 104 provided in the active area.

FIG. 5A is a cross-sectional view of the G terminal 31 shown in FIG. 4A, taken along line B-B, and FIG. 5B is a cross-sectional view of the S terminal and the B terminal shown in FIG. 4B, taken along line C-C. Further, FIG. 5C is a cross-sectional view of the S-B contact 40 shown in FIG. 4B, taken along line D-D. the following description describes the configuration of the G terminal 31, the S terminal 32, the B terminal 33, and the S-B contact 40, while referring to FIGS. 5A to 5C.

(G Terminal)

As shown in FIG. 5A, the G terminal 31 has such a configuration that a gate layer 110 is arranged on the substrate 101. The gate layer 110 is connected with the gate electrode 13a and the gate line 11 (see FIG. 3A) provided in the active area, and is formed integrally with the gate electrode 13a and the gate line 11.

On the gate layer 110, the gate insulating film 102 is separated so that the contact hole CH3 is provided. The insulating film 102 is formed integrally with the gate insulating film 102 (see FIG. 3B) provided in the active area.

On the gate insulating film 102, the first insulating film 103 is arranged outside the contact hole CH3. The first insulating film 103 is formed integrally with the first insulating film 103 (see FIG. 3B) provided in the active area.

On the first insulating film 103, a lower electrode layer 1401a connected with the gate layer 110 through the contact hole CH3 is arranged. The lower electrode layer 1401a is formed with the same material as that of the lower electrode 14a (see FIG. 3B) provided in the active area.

On the lower electrode layer 1401a and the insulating film 103, a semiconductor layer 1501 is arranged outside the contact hole CH3. The semiconductor layer 1501 is formed with a laminate of the same n-type amorphous semiconductor layer 151, intrinsic amorphous semiconductor layer 152, and p-type amorphous semiconductor layer 153 as those of the photoelectric conversion layer 15 provided in the active area. The semiconductor layer 1501 has such a tapered shape that the upper end part of the semiconductor layer 1501 is positioned inside with respect to the bottom thereof.

On the semiconductor layer 1501, an upper electrode layer 1401b is arranged outside the contact hole CH3. The upper electrode layer 1401b is formed with the same material as that of the upper electrode 14b (see FIG. 3B) provided in the active area. The end of the upper electrode layer 1401b in the X-axis direction is arranged inside with respect to the bottom-side end of the semiconductor layer 1501 in the X-axis direction.

On the upper electrode layer 1401b, a conductive film 1701 connected with the lower electrode layer 1401a at the contact hole CH3 is arranged. The conductive film 1701 is formed with the same material as that of the conductive film 17 (see FIG. 3B) provided in the active area.

(S Terminal and B Terminal)

As shown in FIG. 5B, the S terminal 32 and the B terminal 33 have the same structure. Regarding the S terminal 32 and the B terminal 33, the gate insulating film 102 is arranged on the substrate 101. The gate insulating film 102 in the S terminal 32 and the B terminal 33 is formed integrally with the gate insulating film 102 (see FIG. 3B) provided in the active area.

On the gate insulating film 102, the source layer 100 is arranged. The source layer 100 is formed integrally with the source electrode 13c and the source line 10 (see FIG. 3A) provided in the active area.

On the source layer 100, the first insulating film 103 is separated so that the contact hole CH4 is provided. The first insulating film 103 in the S terminal 32 and the B terminal 33 is formed integrally with the first insulating film 103 (see FIG. 3B) provided in the active area.

On the first insulating film 103, a lower electrode layer 1402a connected with the source layer 100 through the contact hole CH4 is arranged. The lower electrode layer 1402a is formed with the same material as that of the lower electrode 14a (see FIG. 3B) provided in the active area.

On the lower electrode layer 1402a and the first insulating film 103, a semiconductor layer 1502 is arranged outside the contact hole CH4. The semiconductor layer 1502 is formed with a laminate of the same n-type amorphous semiconductor layer 151, intrinsic amorphous semiconductor layer 152, and p-type amorphous semiconductor layer 153 as those of the photoelectric conversion layer 15 provided in the active area. The semiconductor layer 1502 has such a tapered shape that the upper end part of the semiconductor layer 1502 is positioned inside with respect to the bottom thereof.

On the semiconductor layer 1502, an upper electrode layer 1402b is arranged outside the contact hole CH4. The upper electrode layer 1402b is formed with the same material as that of the upper electrode 14b (see FIG. 3B) provided in the active area. The end of the upper electrode layer 1402b in the X-axis direction is arranged inside with respect to the bottom-side end of the semiconductor layer 1502 in the X-axis direction.

On the upper electrode 14b, a conductive film 1702 connected with the lower electrode layer 1402a at the contact hole CH4 is arranged. The conductive film 1702 is formed with the same material as that of the conductive film 17 (see FIG. 3B) provided in the active area.

In this way, the semiconductor layers 1501, 1502 are in the tapered shapes, and lateral side ends of the upper electrode layers 1401b, 1402b are arranged on inner sides with respect to the lateral side ends of the semiconductor layers 1501, 1502 on the bottom side thereof, whereby the conductive films 1701, 1702 arranged on the upper electrode layers 1401b, 1502b can be formed along side surfaces of the upper electrodes 1401b, 1402b and the semiconductor layers 1501, 1502 of the contact holes CH3, CH4. As a result, it is unlikely that steps would be formed in the conductive films 1701, 1702, whereby disconnection can be prevented. Further, when a COF (chip on film), a COG (chip on glass), or the like is mounted on the terminal, a large contact area can be ensured between the COF or the COG and the terminal, which makes it possible to keep contact resistance stable.

(S-B Contact)

As shown in FIG. 4B, a source layer 100a in the B terminal 33 is connected with the bias line 16 at the S-B contact 40. The source layer 100a is formed with the same material as that of the source electrode 13c and the source line 10. The S-B contact 40 has such a configuration that, as shown in FIG. 5C, the source layer 100a and the transparent conductive film 160a formed with the same material as that of the bias line 16 are connected through a contact hole CH4a. On the source layer 100a, the following are provided in the stated order: the first insulating film 103; the second insulating film 104; the third insulating film 105; the fourth insulating film 106; the fifth insulating film 107; and the sixth insulating film 108. The contact hole CH4a passes through the first insulating film 103, the second insulating film 104, the fourth insulating film 106, and the fifth insulating film 107, on the source layer 100a.

(Method for Producing Imaging Panel 1)

Figure 6A:
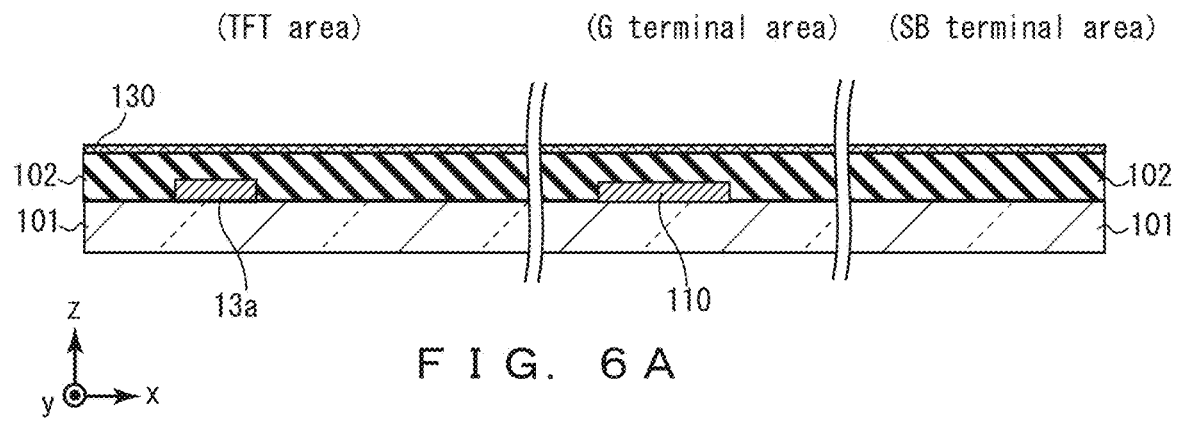
FIG. 6A is a cross-sectional view for explaining a process for producing the TFT area, the G terminal area, and the SB terminal area, the view showing a step of forming a gate insulating film, a gate electrode as well as a gate layer, and a semiconductor layer of the TFT in this order on the substrate.
Figure 6B:
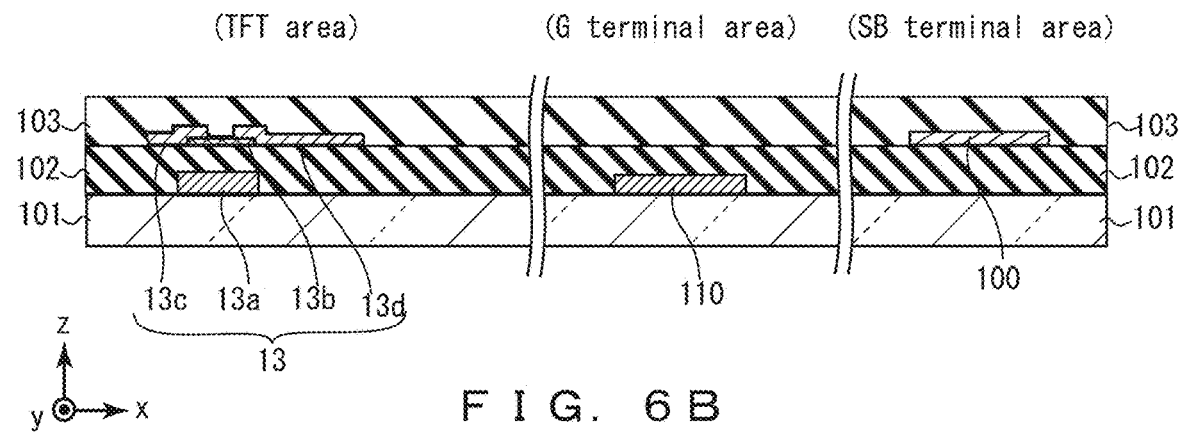
FIG. 6B is a cross-sectional view showing a step of forming a first insulating film on the semiconductor layer shown in FIG. 6A, forming a source electrode and a drain electrode in the TFT area, and forming a source layer in the SB terminal area.
Figure 6C:
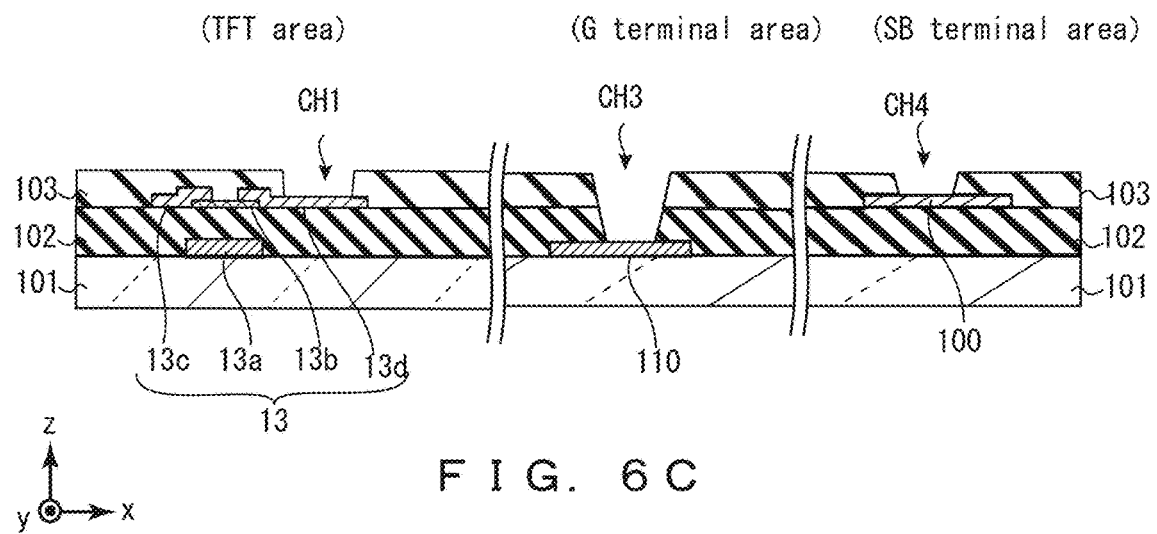
FIG. 6C is a cross-sectional view showing a step of forming contact holes CH1, CH3, and CH4 in the TFT area, the G terminal area, and the SB terminal area shown in FIG. 6B, respectively.

Next, the following description describes a method for producing the imaging panel 1. FIGS. 6A to 6U are cross-sectional views that respectively illustrate steps in the process for producing the TFT area where the TFT 13 is provided, the G terminal area, and the SB terminal area in the active area of the imaging panel 1.

As shown in FIG. 6A, a metal film made of molybdenum nitride and a metal film made of aluminum are formed on the substrate 101 in the stated order by, for example, sputtering. Photolithography and wet etching are carried out so that the metal film is patterned. Through these steps, the gate electrode 13a is formed in the TFT area, and the gate layer 110 is formed in the G terminal area. Then, the gate insulating film 102 obtained by laminating silicon oxide ($SiO_x$) and silicon nitride ($SiN_x$) in the order is formed so as to cover the gate electrode 13a and the gate layer 110. Thereafter, on the gate insulating film 102, the semiconductor layer 130 formed with amorphous oxide semiconductor containing indium (In), gallium (Ga), and zinc (Zn) at a predetermined ratio is formed.

Subsequently, photolithography method and dry etching are carried out so that the semiconductor layer 130 is patterned, whereby the semiconductor activity layer 13b is formed in the TFT area. Thereafter, films of molybdenum nitride (MoN), aluminum (Al), and molybdenum nitride (MoN) are formed in this order by, for example, sputtering so as to cover the semiconductor activity layer 13b. Then, photolithography and wet etching are carried out so that these metal films are patterned. Through these steps, in the TFT area, the source electrode 13c and the drain electrode 13d are formed so as to be separated from each other on the semiconductor activity layer 13b, whereby the TFT 13 is formed. Further, in the SB terminal area, the source layer 100 is formed. Then, the first insulating film 103 made of silicon nitride (SiN) is formed so as to cover the TFT 13 and the source layer 100 by, for example, plasma CVD (see FIG. 6B).

Subsequently, a heat treatment at about 350° C. is applied to an entire surface of the substrate 101, and photolithography and wet etching are carried out so that the first insulating film 103 is patterned. Through these steps, a contact hole CH1 is formed on the drain electrode 13d in the TFT area, a contact hole CH3 is formed on the gate layer 110 in the G terminal area, and a contact hole CH4 is formed on the source layer 100 in the SB terminal area (see FIG. 6C).

Figure 6D:
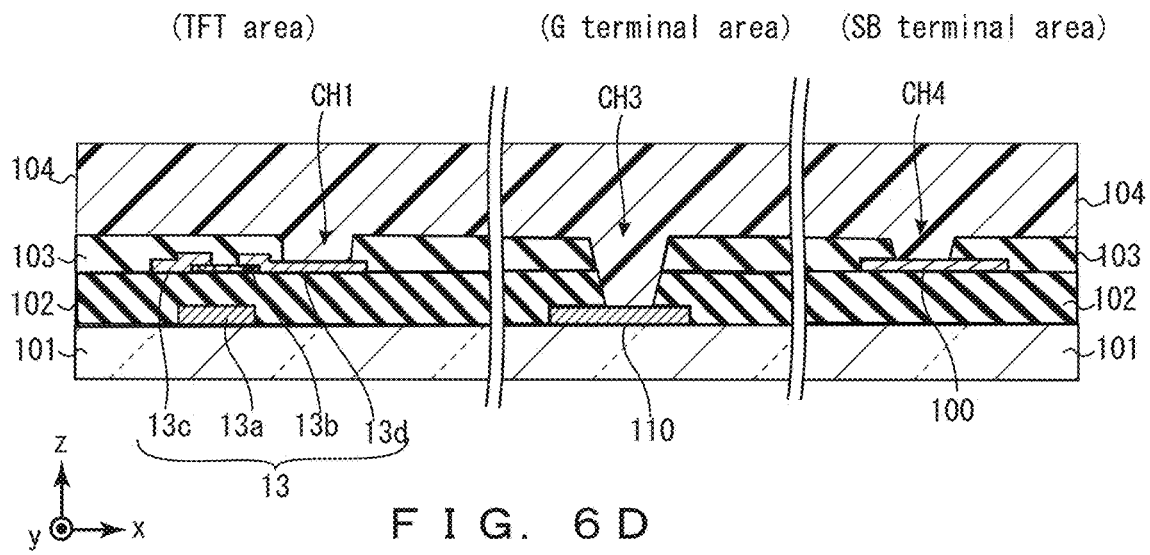
FIG. 6D is a cross-sectional view showing a step of forming a second insulating film on the first insulating film shown in FIG. 6C.

Next, the second insulating film 104 made of acrylic resin or siloxane-based resin is formed on the first insulating film 103 by, for example, slit coating (see FIG. 6D).

Figure 6E:
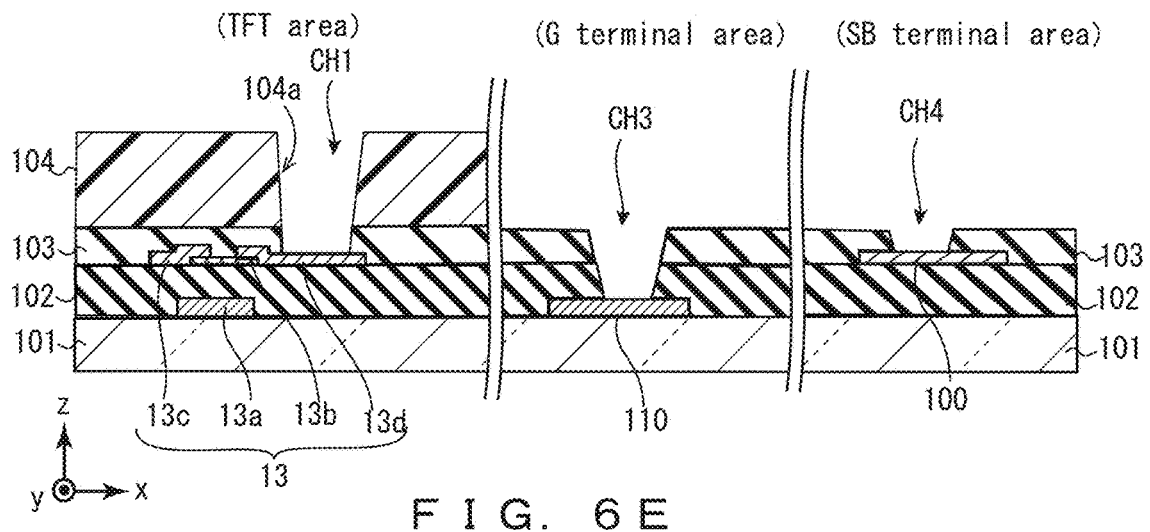
FIG. 6E is a cross-sectional view showing a step of forming an opening of the second insulating film in the TFT area shown in FIG. 6D.

Then, an opening 104a of the second insulating film 104 is formed by photolithography on the contact hole CH1 in the TFT area, and the second insulating film 104 in the G terminal area and the SB terminal area is removed (see FIG. 6E).

Figure 6F:
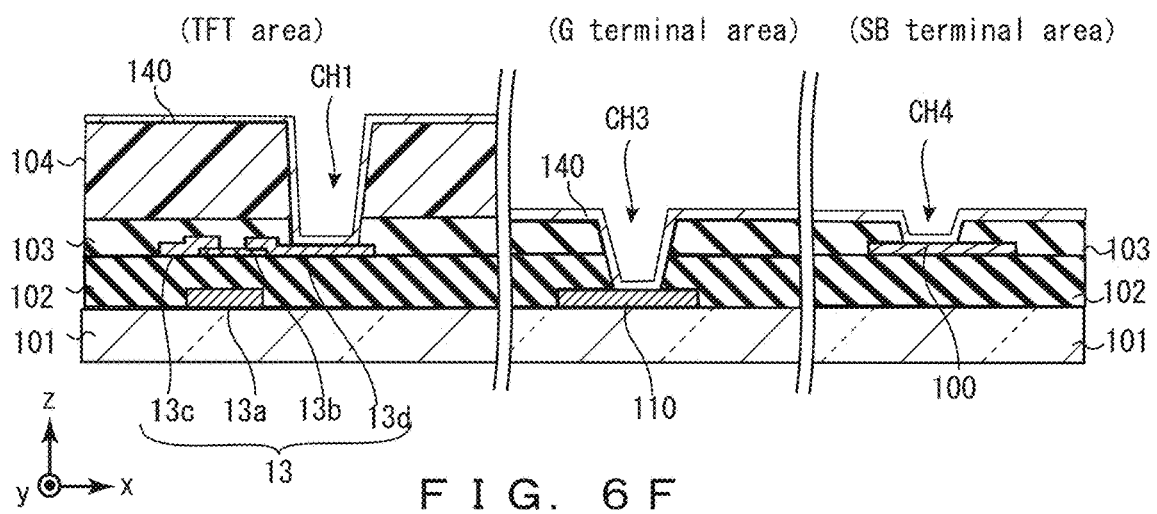
FIG. 6F is a cross-sectional view showing a step of forming a metal film in the TFT area, the G terminal area, and the SB terminal area shown in FIG. 6E.

Subsequently, on the second insulating film 104, a metal film 140 in which molybdenum (Mo), aluminum (Al), and molybdenum (Mo) are laminated in the order is formed by, for example, sputtering (see FIG. 6F).

Figure 6G:
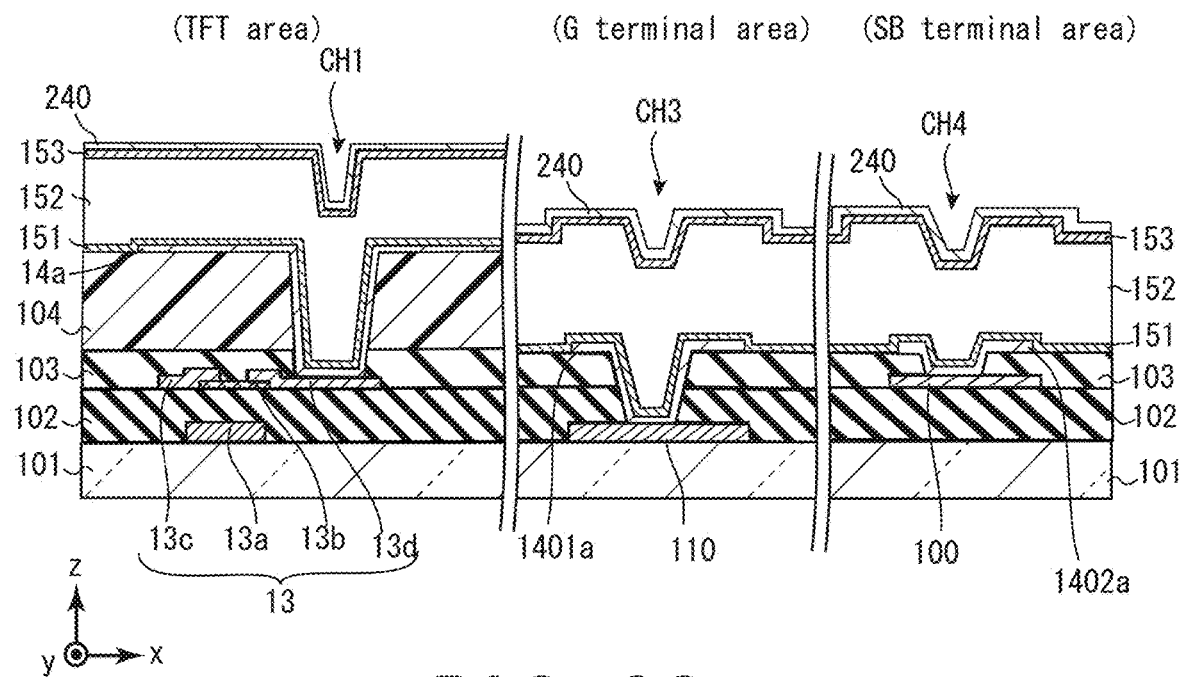
FIG. 6G is a cross-sectional view showing a step of forming a lower electrode in the TFT area shown in FIG. 6F, forming a lower electrode layer in the G terminal area and the SB terminal area, and forming an n-type amorphous semiconductor layer, an intrinsic amorphous semiconductor layer and a p-type amorphous semiconductor layer, as well as a transparent conductive film.

Then, photolithography and wet etching are carried out, whereby the metal film 140 is patterned. Through these steps, on the second insulating film 104 in the TFT area, there is formed the lower electrode 14a that is connected with the drain electrode 13d through the contact hole CH1. Further, on the first insulating film 103 in the G terminal area, there is formed the lower electrode layer 1401a that is connected with the gate layer 110 through the contact hole CH3. Still further, on the first insulating film 103 in the SB terminal area, there is formed the lower electrode layer 1402a that is connected with the source layer 100 through the contact hole CH4. Subsequently, the n-type amorphous semiconductor layer 151, the intrinsic amorphous semiconductor layer 152, and the p-type amorphous semiconductor layer 153 are formed in the stated order by, for example, plasma CVD, so as to cover the lower electrode 14a, and the lower electrode layers 1401a, 1402a. Then, on the p-type amorphous semiconductor layer 153, a transparent conductive film 240 made of, for example, ITO is formed (see FIG. 6G).

Figure 6H:
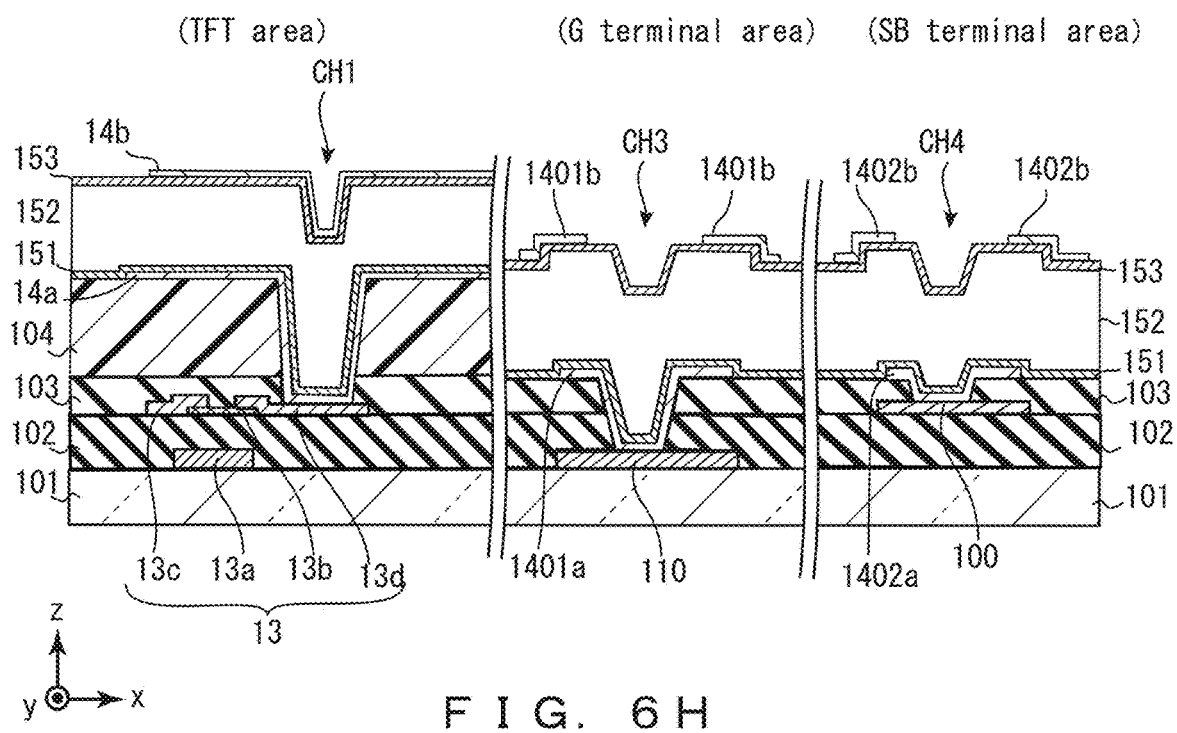
FIG. 6H is a cross-sectional view showing a step of forming an upper electrode in the TFT area shown in FIG. 6G, and forming an upper electrode layer in the G terminal area and the SB terminal area shown therein.
Figure 6K:
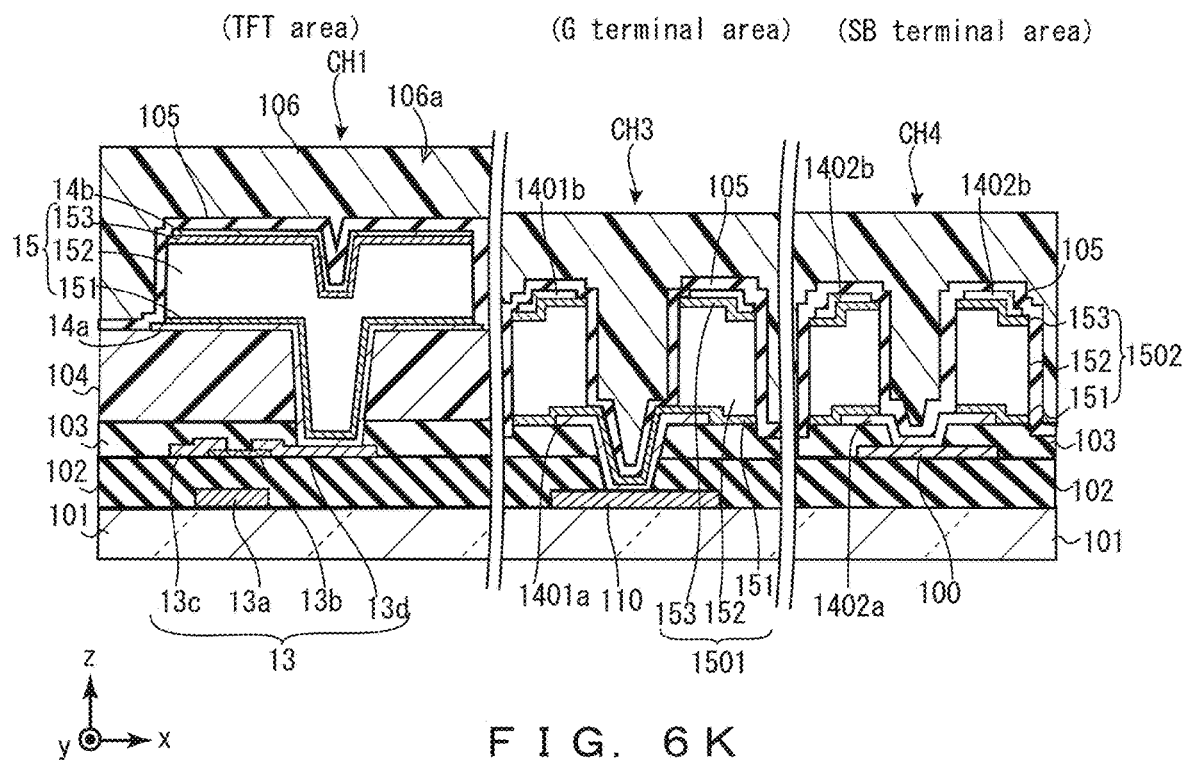
FIG. 6K is a cross-sectional view showing a step of forming a fourth insulating film on the third insulating film in the TFT area, the G terminal area and the SB terminal area shown FIG. 6J.

Thereafter, photolithography and dry etching are carried out so as to pattern the transparent conductive film 240. Through these steps, the upper electrode 14b is formed on the p-type amorphous semiconductor layer 153 in the TFT area. Further, on the p-type amorphous semiconductor layer 153 in the G terminal area, the upper electrode layers 1401b are arranged so as to be separated from each other above the contact hole CH3. Further, on the p-type amorphous semiconductor layer 153 in the SB terminal area, the upper electrode layers 1402b are arranged so as to be separated from each other above the contact hole CH4 (see FIG. 6H).

Subsequently, photolithography and dry etching are carried out so that the p-type amorphous semiconductor layer 153, the intrinsic amorphous semiconductor layer 152, and the n-type amorphous semiconductor layer 153 are patterned. Through these steps, in the TFT area, the photoelectric conversion layer 15 having a width in the X-axis direction that is smaller than that of the lower electrode 14a and that is greater than that of the upper electrode 14 is formed. Further, in the G terminal area, the semiconductor layer 1501 is formed in an area portion where the upper electrode layer 1401b is provided, and in the SB terminal area, the semiconductor layer 1502 is formed in an area portion where the upper electrode layer 1402b is provided (see FIG. 6I).

Next, the third insulating film 105 made of silicon nitride (SiN) is formed by, for example, plasma CVD, so as to cover the photoelectric conversion layer 15, and the semiconductor layers 1501, 1502 (see FIG. 6J).

Subsequently, on the third insulating film 105, the fourth insulating film 106 made of acrylic resin or siloxane-based resin is formed by, for example, slit coating (see FIG. 6K).

Figure 6L:
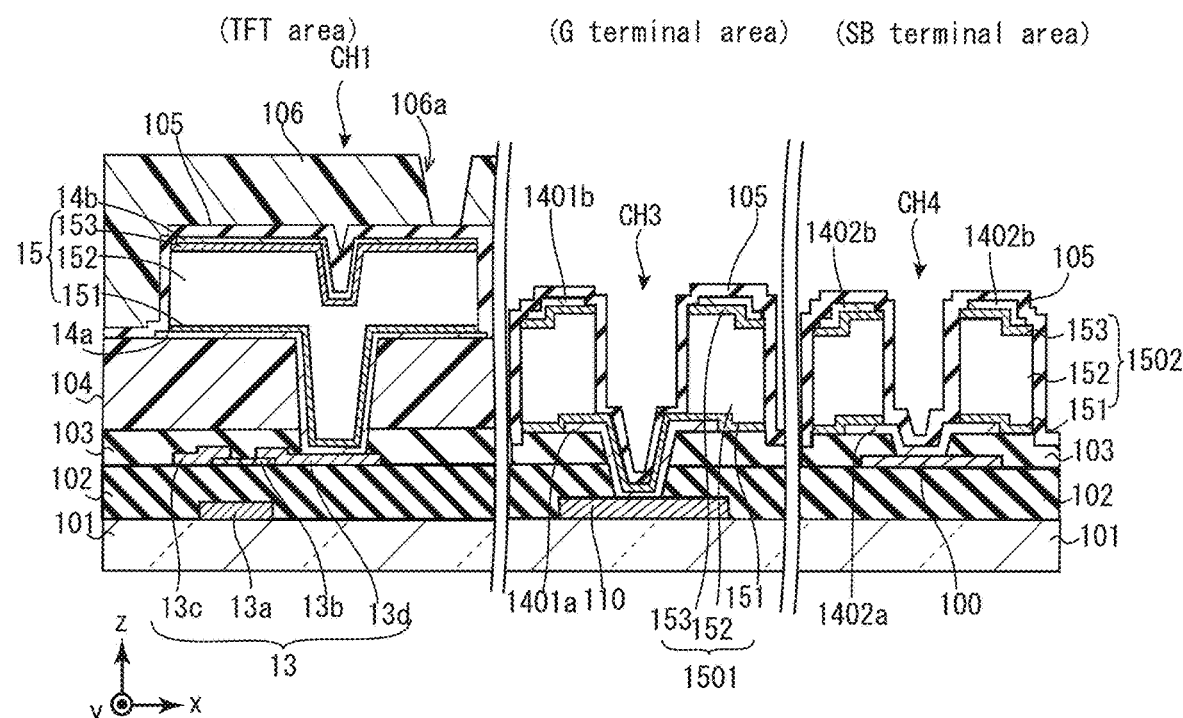
FIG. 6L is a cross-sectional view showing a step of forming an opening in the fourth insulating film in the TFT area shown in FIG. 6K, and removing the fourth insulating film in the G terminal area and the SB terminal area shown therein.
Figure 6M:
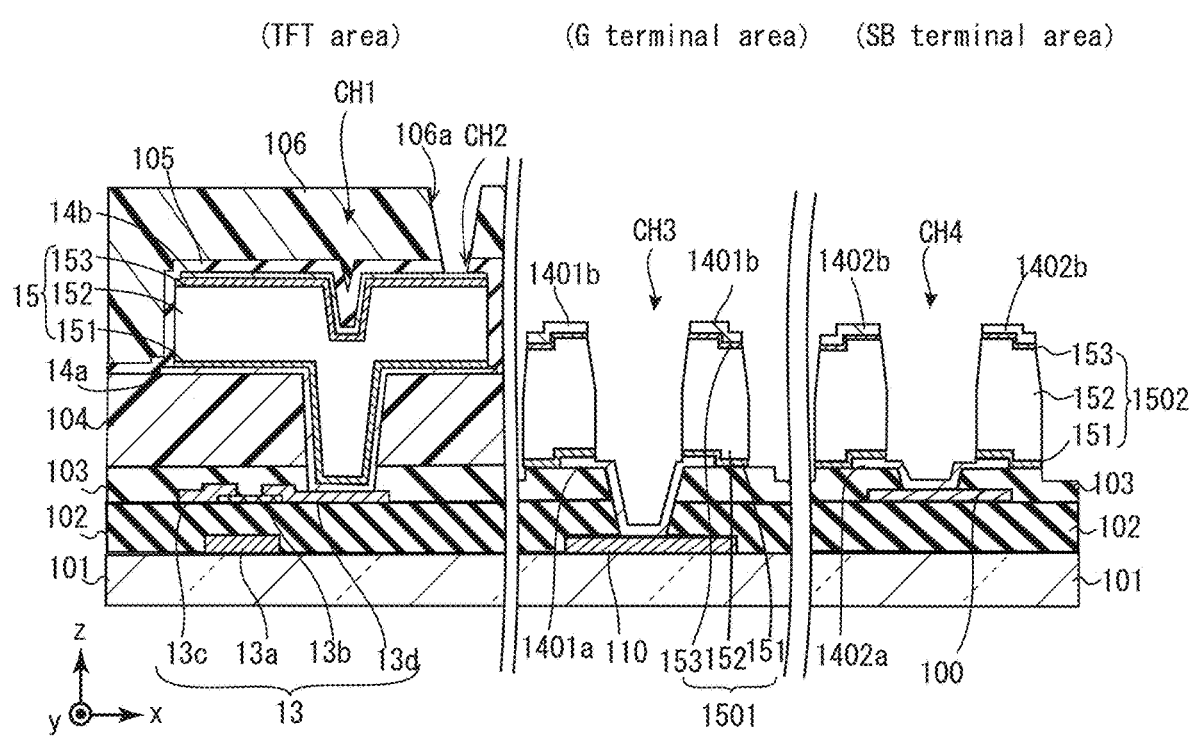
FIG. 6M is a cross-sectional view showing a step of forming a contact hole CH2 in the third insulating film in the TFT area shown in FIG. 6L, and removing the third insulating film in the G terminal area and the SB terminal area shown therein.
Figure 6O:
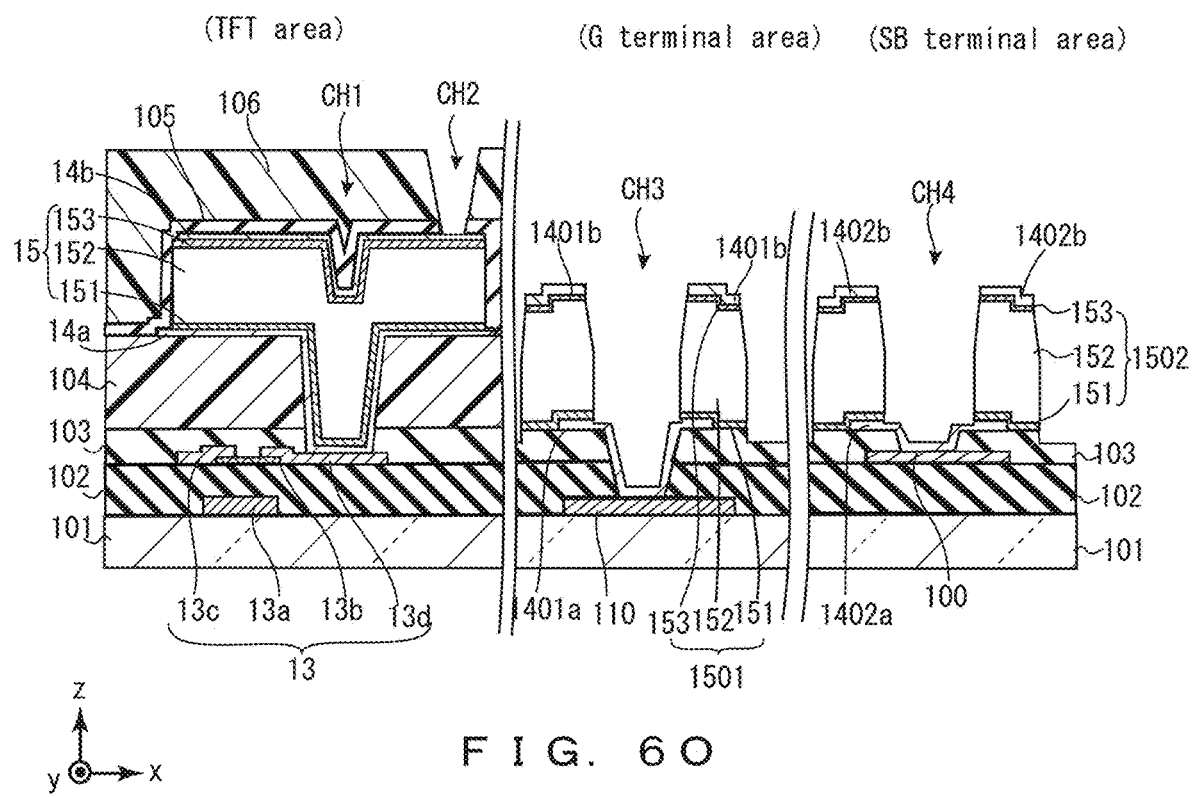
FIG. 6O is a cross-sectional view showing a step of patterning the transparent conductive film shown in FIG. 6N so as to form a bias line in the TFT area, and removing the metal film in the G terminal area and the SB terminal area.

Thereafter, photolithography and wet etching are carried out so as to form an opening 106a of the fourth insulating film 106 on a part of the upper electrode 14 in the TFT area, and remove the fourth insulating film 106 in the G terminal area and the SB terminal area (see FIG. 6L).

Next, in the TFT area, the third insulating film 105 is dry-etched by using the fourth insulating film 106 as a mask, so that the contact hole CH2 that passes through the third insulating film 105 is formed under the opening 106a. The third insulating film 105 in the G terminal area and the SB terminal area is simultaneously etched. Here, in the G terminal area and the SB terminal area, the upper electrode layers 1401b, 1402b and the semiconductor layers 1051, 1052 serve as masks, whereby the first insulating film 103 covered with the upper electrode layers 1401b, 1402b and the semiconductor layers 1051, 1052 in the G terminal area and the SB terminal area remains (see FIG. 6M).

Next, a metal film 160 is formed by laminating molybdenum nitride (MoN), aluminum (Al), and titanium (Ti) in this order by, for example, sputtering, so as to cover the fourth insulating film 106 in the TFT area, as well as the first insulating film 103, the upper electrode layers 1401b, 1402b and the semiconductor layers 1051, 1052 in the G terminal area and the SB terminal area (see FIG. 6N).

Then, photolithography and wet etching are carried out so that the metal film 160 is patterned. Through these steps, though the illustration is omitted, the bias line 16 (see FIG. 3B) is formed in the TFT area. Then, the G terminal area and the SB terminal area are in a state in which the metal film 160 is removed (see FIG. 6O).

Figure 6P:
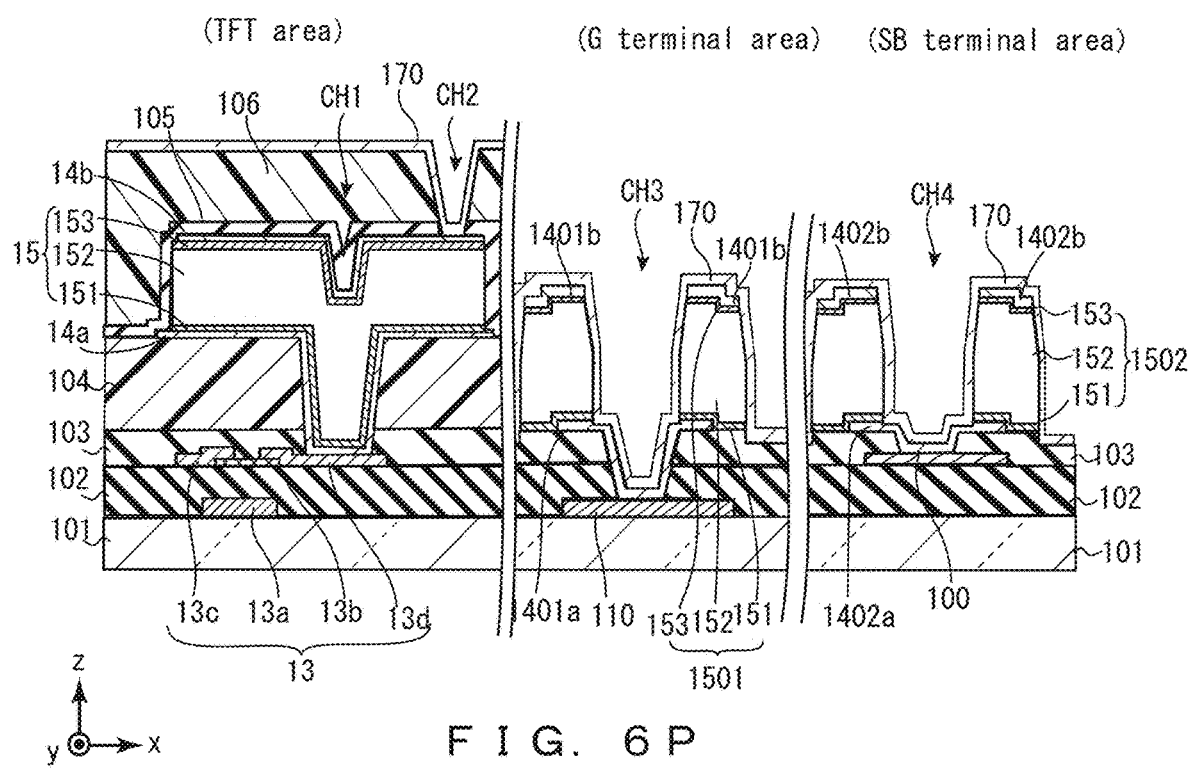
FIG. 6P is a cross-sectional view showing a step of forming a transparent conductive film in the TFT area, the G terminal area and the SB terminal area shown in FIG. 6O.

Subsequently, the transparent conductive film 170 made of ITO is formed by, for example, sputtering so as to cover the fourth insulating film 106 and the bias line 16 (see FIG. 3B) in the TFT area, as well as the first insulating film 103, the upper electrode layers 1401b, 1402b, and the semiconductor layers 1051, 1052 in the G terminal area and the SB terminal area (see FIG. 6P).

Figure 6Q:
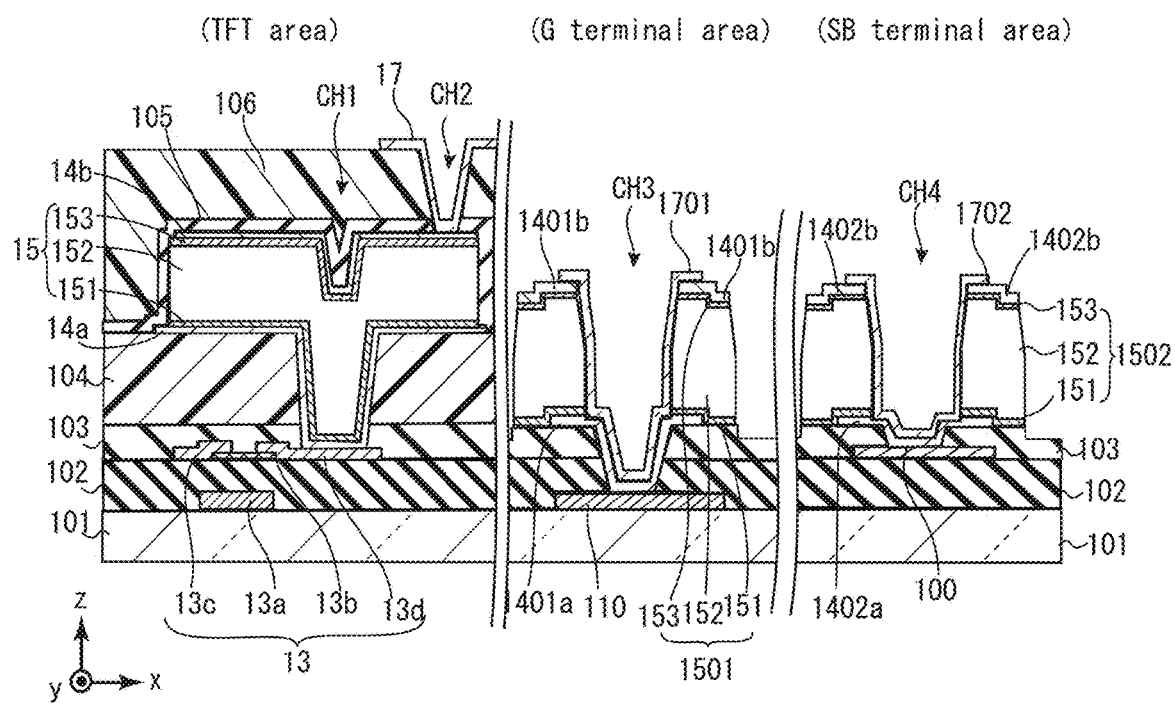
FIG. 6Q is a cross-sectional view showing a step of patterning the transparent conductive film shown in FIG. 6P, and forming a conductive film in the TFT area, the G terminal area and the SB terminal area.

Then, photolithography and dry etching are carried out so as to pattern the transparent conductive film 170. Through these steps, the transparent conductive film 17 that is connected with the bias line 16 in the TFT area (see FIG. 3B) and connected with the upper electrode 14b through the contact hole CH2 is formed. Further, in the G terminal area, the conductive film 1701 is formed, which partially covers the two upper electrode layers 1401b that are arranged so as to be separated from each other above the contact hole CH3, and is connected with the lower electrode layer 1401a through the contact hole CH3. Further, in the SB terminal area, the conductive film 1702 is formed, which partially covers the two upper electrode layers 1402b that are arranged so as to be separated from each other above the contact hole CH4, and is connected with the lower electrode layer 1402a through the contact hole CH4 (see FIG. 6Q).

Figure 6R:
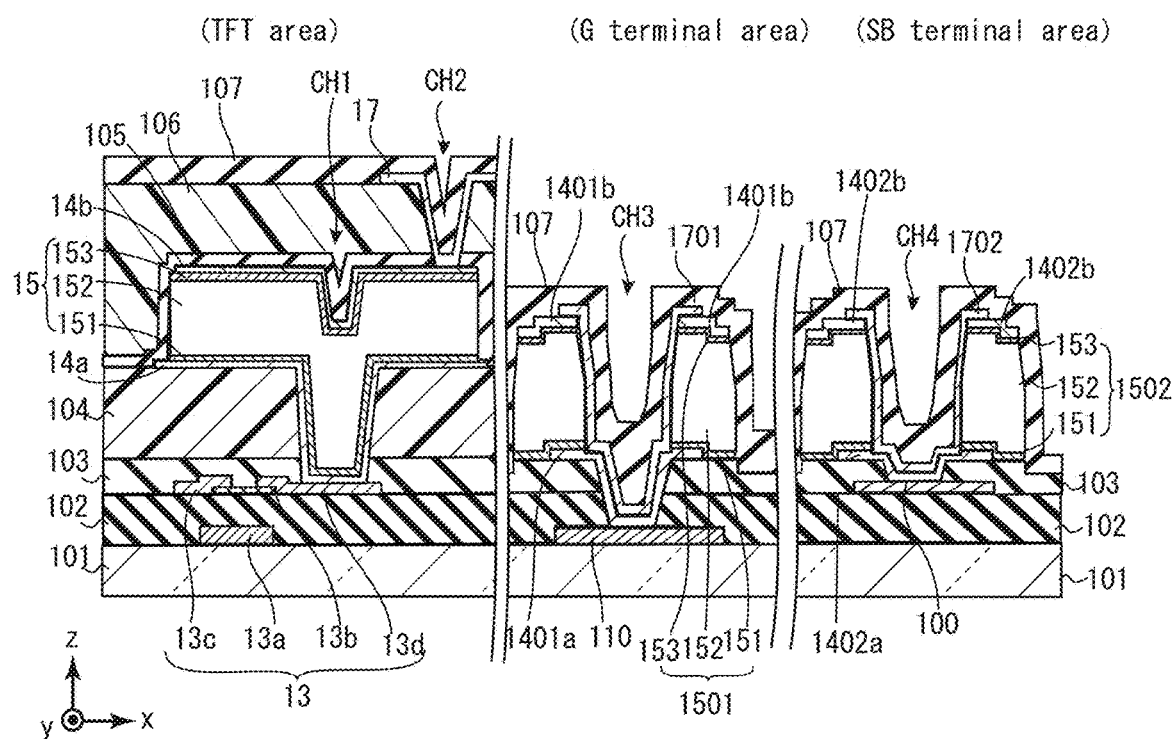
FIG. 6R is a cross-sectional view showing a step of forming a fifth insulating film in the TFT area, the G terminal area and the SB terminal area shown in FIG. 6Q.

Next, the fifth insulating film 107 made of silicon nitride (SiN) is formed by, for example, plasma CVD so as to cover the transparent conductive films 17, 1701, 1702 in the TFT area, the G terminal area, and the SB terminal area (see FIG. 6R).

Figure 6S:
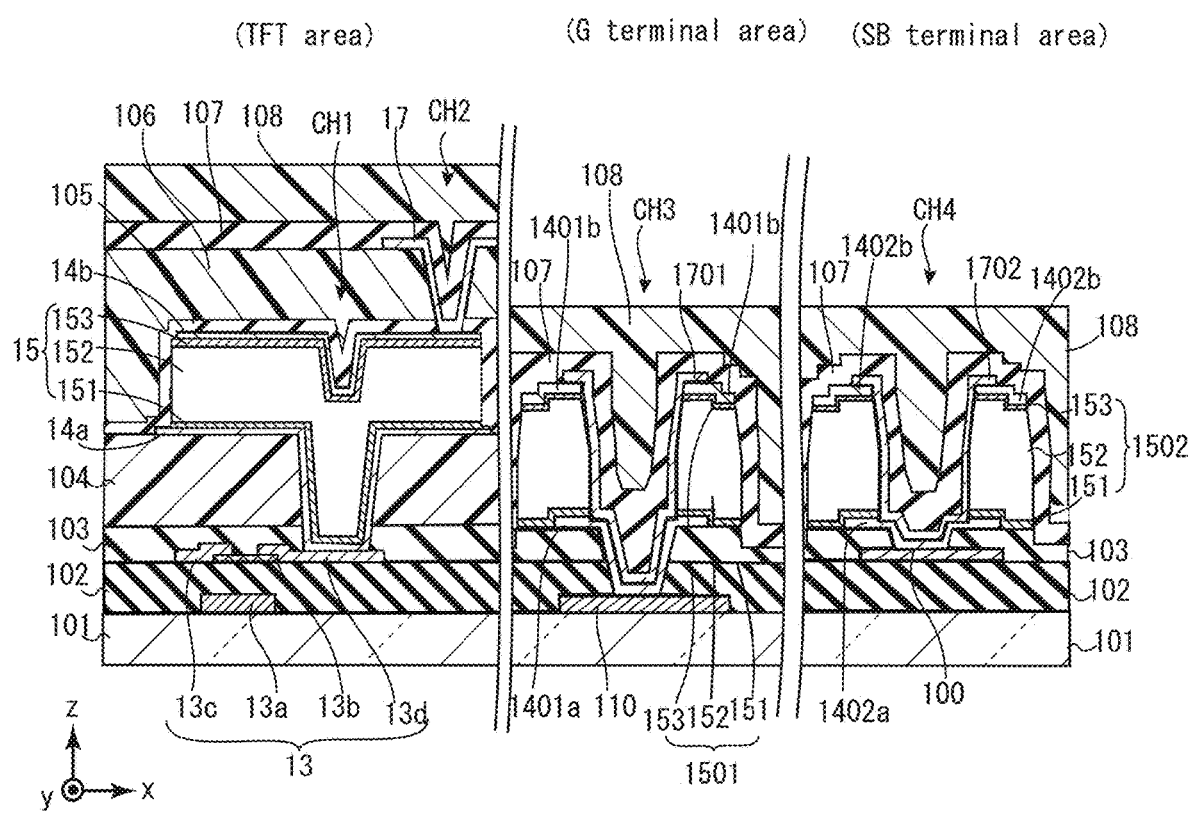
FIG. 6S is a cross-sectional view showing a step of forming a sixth insulating film on the fifth insulating film shown in FIG. 6R.
Figure 6U:
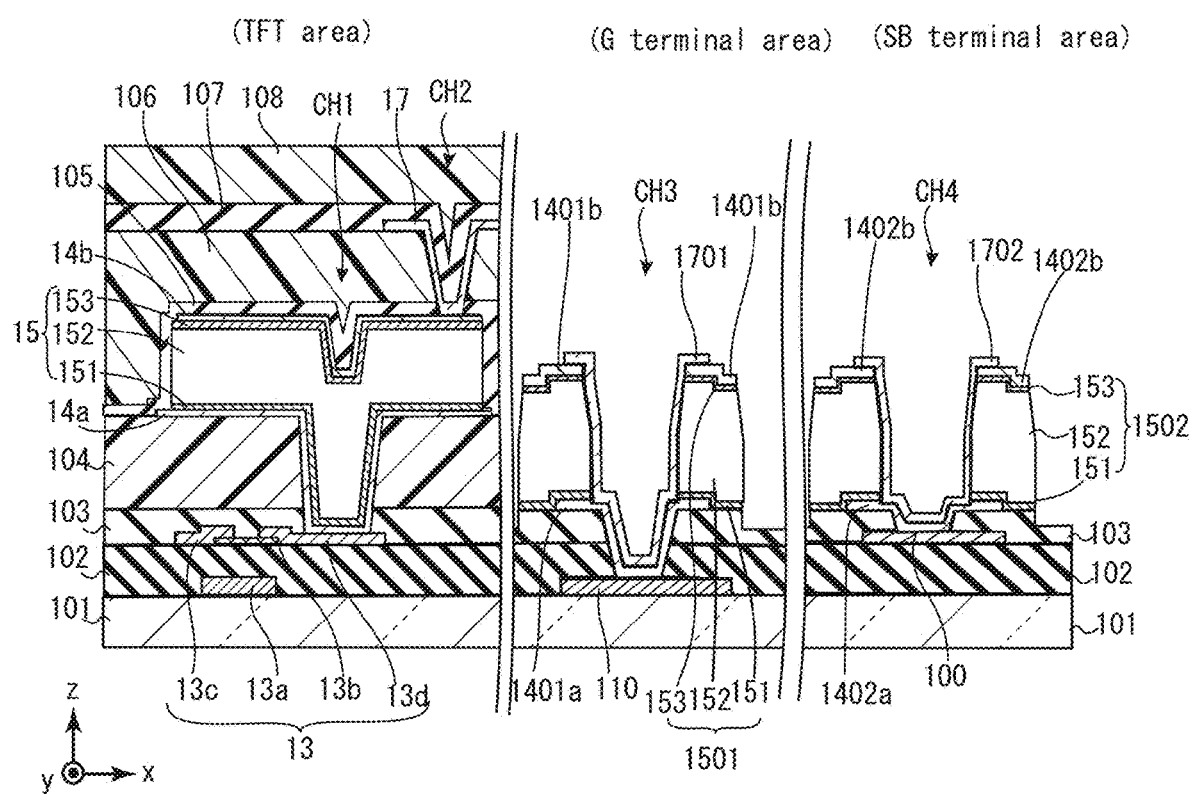
FIG. 6U is a cross-sectional view showing a step of removing the fifth insulating film in the G terminal area and the SB terminal area shown in FIG. 6T.

Subsequently, the sixth insulating film 108 made of acrylic resin or siloxane-based resin is formed on the fifth insulating film 107 by, for example, slit-coating (see FIG. 6S).

Thereafter, photolithography and dry etching are carried out to the sixth insulating film 108 so that the parts thereof in the G terminal area and the SB terminal area are removed (see FIG. 6T).

Next, photolithography and dry etching are carried out to the fifth insulating film 107 so that the parts thereof in the G terminal area and the SB terminal area are removed (see FIG. 6U). Here, the upper electrode layers 1401b, 1402b and the transparent conductive films 1701, 1702 are not etched by dry etching, but parts of the semiconductor layer 1051, 1052 and the first insulating film 103 that are not covered with the upper electrode layers 1401b, 1402b and the transparent conductive films 1701, 1702 are etched. It should be noted that, in the step shown in FIG. 6T in which the patterning and removing of the sixth insulating film 108 is carried out, the fifth insulating film 107 may be simultaneously etched.

What is described above is the method for producing the imaging panel 1 in Embodiment 1. As described above, in the step shown in FIG. 6M, the third insulating film 105 is etched by using the fourth insulating film 106 in the active area so that the contact hole CH2 is formed in the active area, and the third insulating film 105 in the G terminal area and the SB terminal area is removed.

In a case where the semiconductor layers 1501, 1502 and the upper electrode layers 1401b, 1402b are not formed in the G terminal area and the SB terminal area, this results in that the third insulating film 105 is formed on the lower electrode layers 1401a, 1402a. If the step shown in FIG. 6M is carried out in this state so as to etch the third insulating film 105 by using the fourth insulating film 106 in the active area as a mask, the first insulating film 103 for protecting the gate layer 110 and the source layer 100 is etched, too, together with the third insulating film 105 in the G terminal area and the SB terminal area.

Figure 6V:
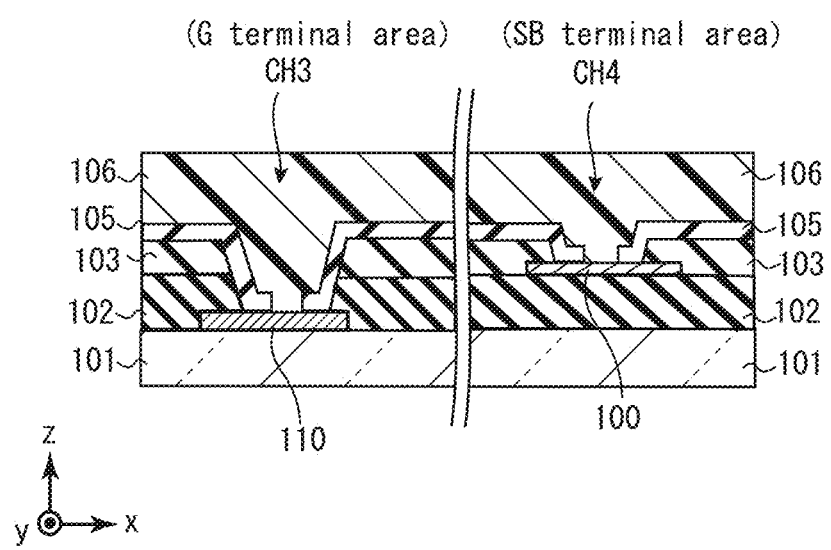
FIG. 6V is a diagram for explaining a process for producing a terminal in a case where the semiconductor layer and the upper electrode layer are not formed in the G terminal area and the SB terminal area.

Alternatively, it can be supposed that the semiconductor layers 1501, 1502 and the upper electrode layers 1401b, 1402b are not formed in the G terminal area and the SB terminal area, and, for example, as shown in FIG. 6V, the contact holes CH3, CH4 are formed with the third insulating film 105 remaining. In this case, the third insulating film 105 is etched by using the fourth insulating film 106 formed on the third insulating film 105 as a mask so that the contact holes CH3, CH4 are formed, which results in that the fourth insulating film 106 remains in the terminal area. Since the fourth insulating film 106 formed with resin should not remain in the terminal area, another step of removing the fourth insulating film 106 in the terminal area is required in addition.

In the present embodiment, in the G terminal area and the SB terminal area, the semiconductor layers 1501, 1502 and the upper electrode layers 1401b, 1402b are provided on the gate layer 110 or the source layer 100. Even if the third insulating film 105 is dry-etched by using the fourth insulating film 106 in the active area as a mask in the step shown in FIG. 6M to form the contact hole CH2, therefore, the upper electrodes 1401b, 1402b and the semiconductor layers 1501, 1502 serve as masks in the G terminal area and the SB terminal area, whereby the first insulating film 103 covering the gate layer 110 and the source layer 100 are not etched, but can remain.

Further, in the present embodiment, when the opening 106a of the fourth insulating film 106 in the active area (see FIG. 6L) is formed, the fourth insulating film 106 formed in the G terminal area and the SB terminal area is removed. Further, when the third insulating film 105 is dry-etched by using the fourth insulating film 106 as a mask so as to form the contact hole CH2 in the active area, the third insulating film 105 in the G terminal area and the SB terminal area is removed (see FIG. 6M). In other words, in the step of forming the contact hole CH2 in the active area, the third insulating film 105 and the fourth insulating film 106 in the G terminal area and the SB terminal area can be simultaneously removed, which makes it unnecessary to provide another step of removing the third insulating film 105 and the fourth insulating film 106. As compared with a case where a semiconductor layer and an upper electrode layer are not formed in the G terminal area and the SB terminal area, therefore, the number of steps for producing an imaging panel can be reduced.

(Operation of X-Ray Imaging Device 1000)

Here, operations of the X-ray imaging device 1000 shown in FIG. 1 are described. First, X-rays are emitted from the X-ray source 3. Here, the control unit 2 applies a predetermined voltage (bias voltage) to the bias line 16 (see FIG. 3A and the like). X-rays emitted from the X-ray source 3 are transmitted through an object S, and are incident on the scintillator 1A. The X-rays incident on the scintillator 1A are converted into fluorescence (scintillation light), and the scintillation light is incident on the imaging panel 1. When the scintillation light is incident on the photodiode 12 provided in each pixel in the imaging panel 1, the scintillation light is changed to charges by the photodiode 12 in accordance with the amount of the light. A signal according to the charges obtained by conversion by the photodiode 12 is read out through the source line 10 to the signal reading unit 2B (see FIG. 2 and the like) when the TFT 13 (see FIG. 3A and the like) is in the ON state according to a gate voltage (positive voltage) that is output from the gate control unit 2A through the gate line 11. Then, an X-ray image in accordance with the signal thus read out is generated in the control unit 2.

Embodiment 2

The present embodiment is described with reference to exemplary G terminal, S terminal, and B terminal that have different structures from those of the G terminal 31, the S terminal 32, and the B terminal 33 in Embodiment 1 described above.

Figure 7A:
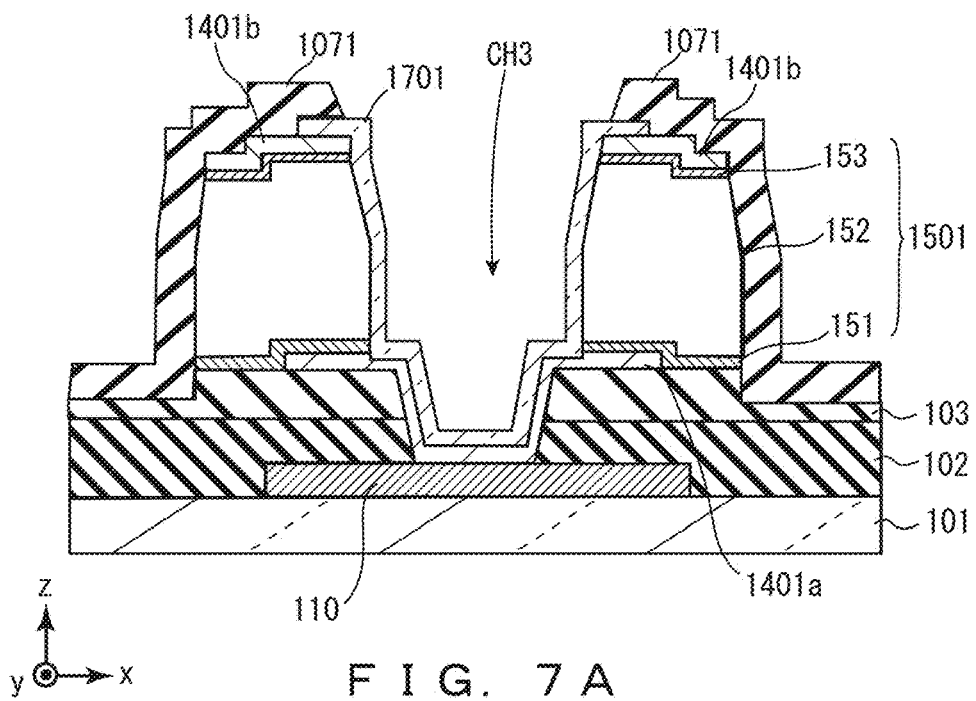
FIG. 7A is a cross-sectional view showing a structure of a G terminal in Embodiment 2.
Figure 7B:
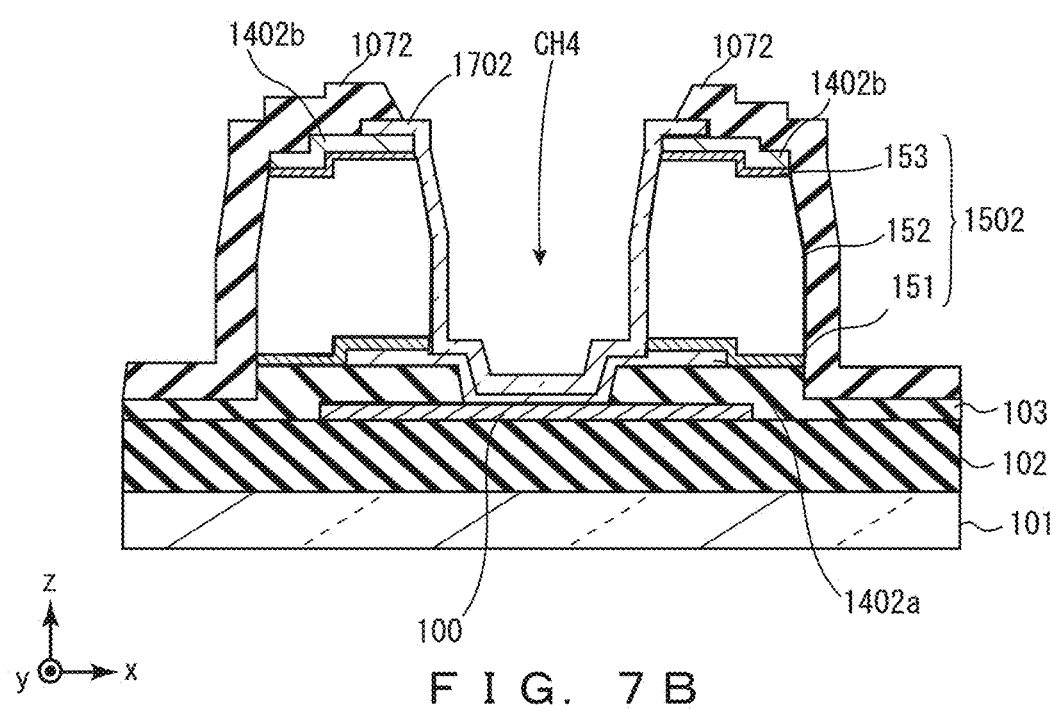
FIG. 7B is a cross-sectional view showing a structure of an S terminal and a B terminal in Embodiment 2.

FIG. 7A is a cross-sectional view of the G terminal in the present embodiment, and FIG. 7B is a cross-sectional view of the S terminal and the B terminal in the present embodiment. In FIGS. 7A and 7B, the same constituent members as those in Embodiment 1 are denoted by the same reference symbols as those in Embodiment 1. The following description describes constituent members that are different from those in Embodiment 1.

As shown in FIG. 7A, on the conductive film 1701, the upper electrode layer 1401b, and the first insulating film 103 of the G terminal 311, in the area from which the contact hole CH3 is excluded, an insulating film 1071 is provided. Further, as shown in FIG. 7B, on the conductive film 1702, the upper electrode layer 1402b, and the first insulating film 103 of the S terminal 321 and the B terminal 331, in the area from which the contact hole CH4 is excluded, an insulating film 1072 is provided.

The insulating films 1071, 1072 are made of the same material as that of the fifth insulating film 107 provided in the active area. The insulating films 1071, 1072 are formed by patterning the fifth insulating film 107 so as to form the contact holes CH3, CH4 in the G terminal area and the SB terminal area by photolithography after the above-described step shown in FIG. 6S.

In the G terminal 311, the S terminal 321, and the B terminal 331 in the present embodiment as well, as is the case with Embodiment 1, the semiconductor layers 1501, 1502 and the upper electrode layers 1401b, 1402b are provided on the gate layer 110 or the source layer 100. These terminals therefore can be produced by using the steps in the active area, as is the case with Embodiment 1. Further, since the insulating film 1071 is provided in the G terminal 311, the S terminal 321, and the B terminal 331 in the present embodiment, they have greater thicknesses than those of the G terminal 31, the S terminal 32, and the B terminal 33 in Embodiment 1. This allows the reliability with respect to each terminal to increase. In addition, as small areas of the fifth insulating film 107 formed in the G terminal area and the SB terminal area are etched in the step shown in FIG. 6S, the etching time is shortened as compared with Embodiment 1, whereby the production costs can be reduced.

[Modification]

Figure 8A:
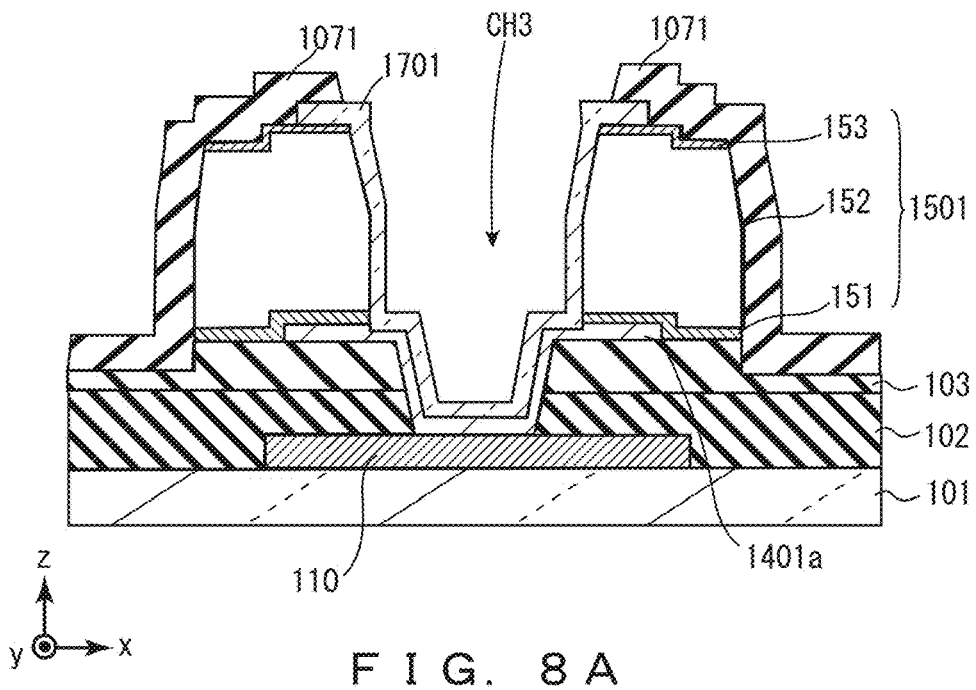
FIG. 8A is a cross-sectional view showing a structure of a G terminal in a modification example of Embodiment 2.
Figure 8B:
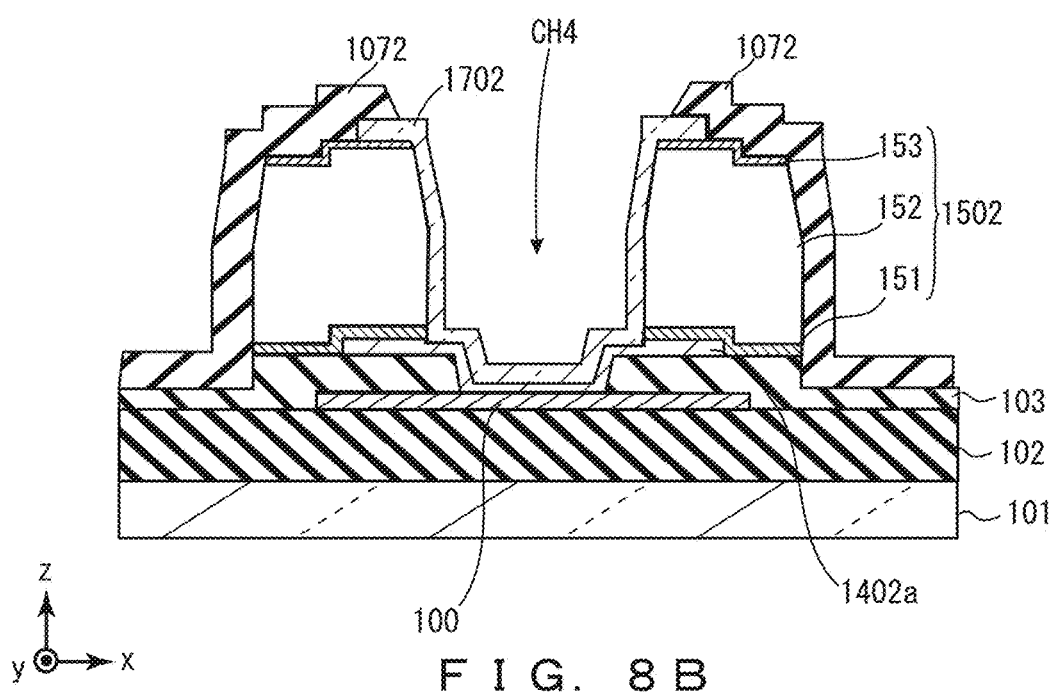
FIG. 8B is a cross-sectional view showing a structure of an S terminal and a B terminal in a modification example of Embodiment 2.

FIG. 8A is a cross-sectional view of a G terminal in the present modification example, and FIG. 8B is a cross-sectional view of an S terminal and a B terminal in the present modification example. Incidentally, in FIGS. 8A and 8B, the same constituent members as those in Embodiment 2 are denoted by the same reference symbols as those in Embodiment 2.

As shown in FIGS. 8A and 8B, the upper electrode layer 1401b is not provided in the G terminal 312 in the present modification example, and the upper electrode layer 1402b is not provided, either, in the S terminal 322 and the B terminal 332. In this case, after the above-described step shown in FIG. 6G, patterning may be carried out in such a manner that all of the transparent conductive film 240 formed in the G terminal area and the SB terminal area is removed.

In this way, in the G terminal 312, the S terminal 322, and the B terminal 332, the upper electrode layers 1401b, 1402b are not provided, but the semiconductor layers 1501, 1502 are provided. As is the case with Embodiment 1, therefore, these terminals can be formed without additional steps of producing these terminals, as compared with a case where the semiconductor layers 1501, 1502 are not formed. Further, even if the third insulating film 105 in each terminal area is etched simultaneously with the etching of the third insulating film 105 in the active area in the step shown in FIG. 6M, each terminal area is masked by the semiconductor layers 1501, 1502, which allows the first insulating film 103 for protecting the gate layer 110 and the source layer 100 to remain.

Embodiment 3

Figure 9:
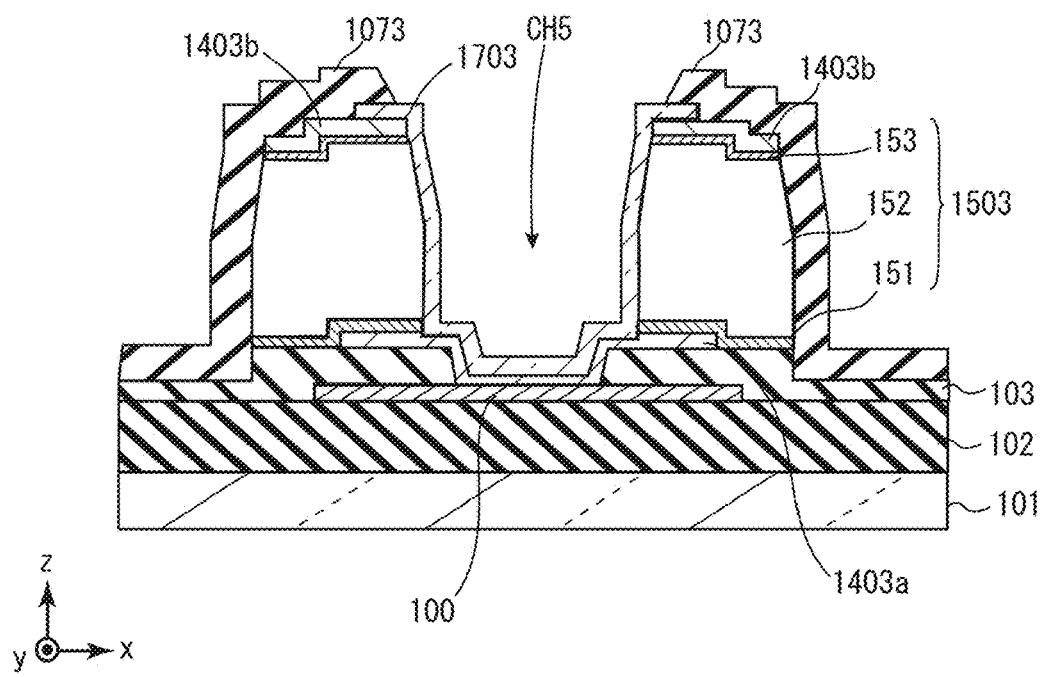
FIG. 9 is a cross-sectional view showing a structure of a G terminal, an S terminal and a B terminal in Embodiment 3.

FIG. 9 is a cross-sectional view of the G terminal 313, the S terminal 323, and the B terminal 333 in the present embodiment. In FIG. 9, the same constituent members as those in Embodiment 2 are denoted by the same reference symbols as those in Embodiment 2. As shown in FIG. 9, the G terminal 313, the S terminal 323, and the B terminal 333 in the present embodiment have a common structure. Though some constituent members in shown in FIG. 9 are denoted by reference symbols different from those in the S terminal 321 and the B terminal 331 shown in FIG. 7B for convenience sake, the terminal structure shown in FIG. 9 is basically the same structure as the structure of the S terminal 321 and the B terminal 331 shown in FIG. 7B.

More specifically, in each of the G terminal 313, the S terminal 323, and the B terminal 333, a lower electrode layer 1403a made of the same material as that of the lower electrode 14a is provided on the first insulating film 103 that has separation on the source layer 100, whereby the source layer 100 and the lower electrode layer 1403a are connected with each other through the contact hole CH5. On the lower electrode layer 1403a and the first insulating film 103, the semiconductor layer 1503 made of the same material as that of the photoelectric conversion layer 15 is separated at the contact hole CH5, and the upper electrode layer 1403b made of the same material as that of the upper electrode 14*b* is separated at the contact hole CH5. On the upper electrode layer 1403*b*, the conductive film 1703 made of the same material as that of the conductive film 17 is provided, and is connected with the lower electrode layer 1403*a* through the contact hole CH5. An insulating film 1073 made of the same material as that of the fifth insulating film 107 is provided on the conductive film 1703, the upper electrode layer 1403*b*, and the first insulating film 103 so as to be separated at the contact hole CH5.

Each structure of the S terminal, the G terminal and the B terminal in the present embodiment is identical to that of the S terminal and the B terminal in Embodiment 2 described above. This therefore causes each terminal to have a greater thickness as compared with Embodiment 1, thereby causing the reliability to the terminal to be improved, as is the case with Embodiment 2. Further, since the etched area of the fifth insulating film 107 formed in the G terminal area and the SB terminal area in the step shown in FIG. 6S is small, the etching time is shortened as compared with Embodiment 1, whereby the production costs can be reduced. Further, such a configuration that the terminals have a common structure makes it possible to mount chips connected to the terminals efficiently, without changing the bonding conditions and the like terminal by terminal.

Figure 10:
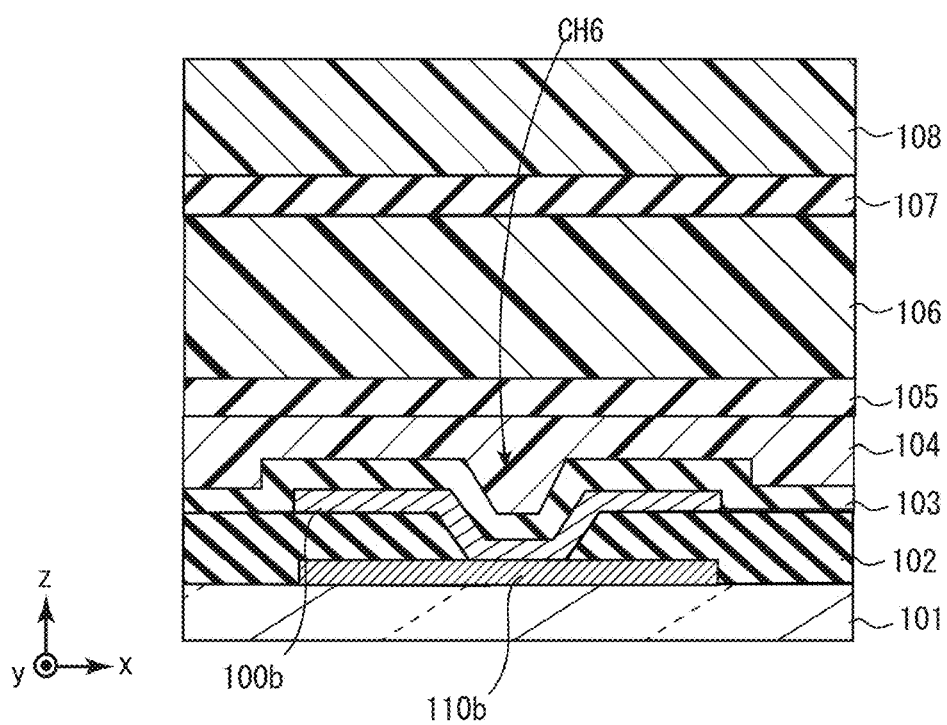
FIG. 10 is a cross-sectional view showing a structure of an S-G contact in Embodiment 3

It should be noted that a contact (S-G contact) that connects the source layer 100 in the G terminal 313 with the gate electrode 13*a* and the gate line 11 is needed in this case. FIG. 10 is a cross-sectional view showing an exemplary configuration of the S-G contact. As shown in FIG. 10, the S-G contact 400 has such a configuration that a gate layer 110*b* made of the same material as that of the gate line 11 is arranged on the substrate 101, and a source layer 100*b* made of the same material as that of the source line 10 is arranged on the gate insulating film 102 arranged so as to have separation on the gate layer 110*b*. The gate layer 110*b* and the source layer 100*b* are connected with each other through the contact hole CH6. On the source layer 100*b*, the first insulating film 103 is provided, and on the first insulating film 103, the second insulating film 104, the third insulating film 105, the fourth insulating film 106, the fifth insulating film 107, and the sixth insulating film 108 are provided in this order.

Modification Example

In the example shown in FIG. 9, the source layer 100 is provided in each terminal, but the configuration may be such that the gate layer 110 is provided instead. Further, in the example shown in FIG. 9, the upper electrode layer is provided in each terminal, but the upper electrode layer does not have to be provided.

FIG. 11 is a cross-sectional view showing an exemplary structure of the S terminal 314, the G terminal 324, and the B terminal 334 in the present modification example. In FIG. 11, the same constituent members as those in Embodiment 3 described above shown in FIG. 9 are denoted by the same reference symbols as those in Embodiment 3. The following description principally describes constituent members different from those shown in FIG. 9.

As shown in FIG. 11, in each of the S terminal 314, the G terminal 324, and the B terminal 334, the gate layer 110 is provided on the substrate 101. On the gate layer 110, the gate insulating film 102 and the first insulating film 103 are provided in this order, and are arranged so as to be separated on the gate layer 110, whereby a contact hole CH7 is formed. A lower electrode layer 1403*a* is connected with the gate layer 110 through the contact hole CH7. Further, each of the S terminal 314, the G terminal 324, and the B terminal 334 includes a semiconductor layer 1504 that is composed of the n-type amorphous semiconductor layer 151 and the intrinsic amorphous semiconductor layer 152, and the conductive film 1703 is provided on the semiconductor layer 1504. In this way, each of the S terminal 314, the G terminal 324, and the B terminal 334 is not provided with an upper electrode layer and a p-type amorphous semiconductor layer.

Figure 12A:
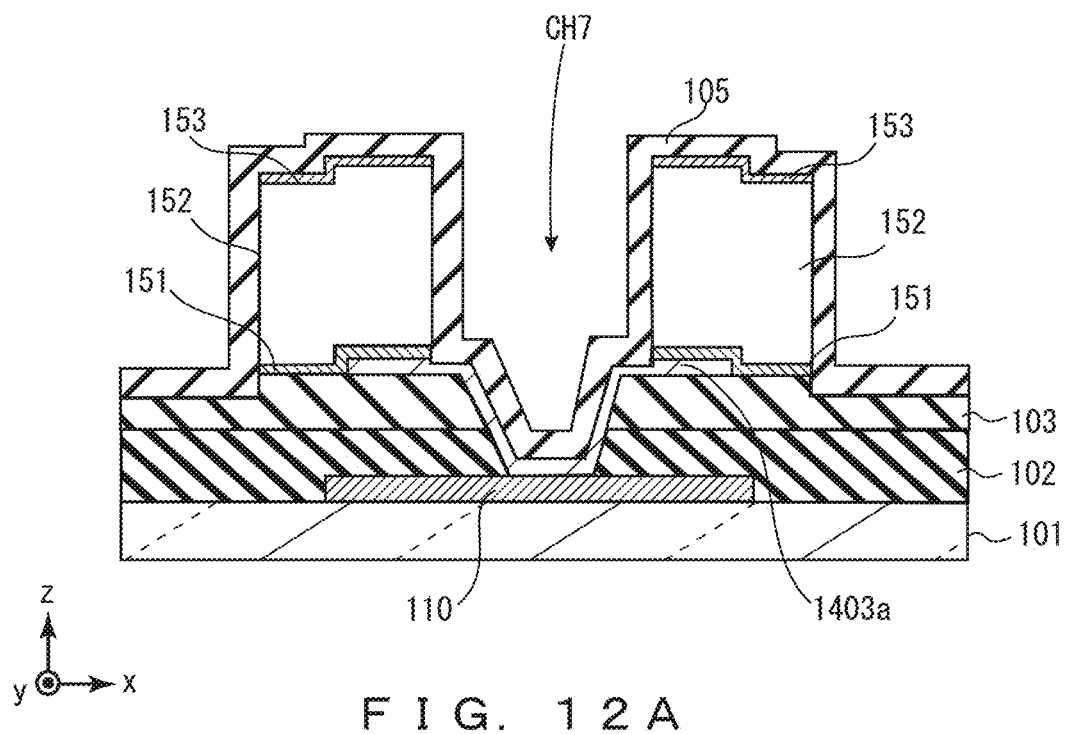
FIG. 12A is a cross-sectional view for explaining a step of producing the terminal shown in FIG. 11.

In the present modification example, steps identical to those shown in FIGS. 6A to 6G are carried out, and when the transparent conductive film 240 is patterned, the transparent conductive film 240 in the G terminal area and the SB terminal area is removed. Thereafter, by the same step as that shown in FIG. 6J, in each terminal area of the S terminal 314, the G terminal 324, and the B terminal 334 in the present modification example, the third insulating film 105 is formed on the p-type amorphous semiconductor layer 153, as shown in FIG. 12A.

Figure 12B:
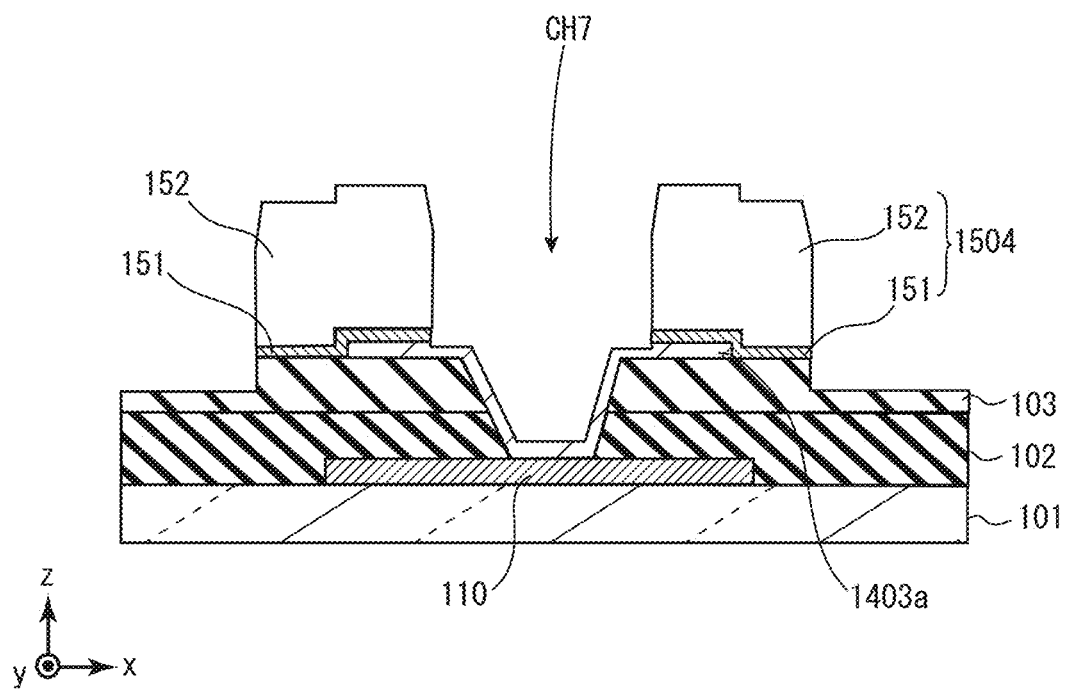
FIG. 12B is a cross-sectional view for explaining a step of producing the terminal shown in FIG. 11.

Thereafter, steps identical to those shown in FIGS. 6K, 6L are carried out so that the opening 106*a* is formed in the fourth insulating film 106 in the active area, and the third insulating film 105 is etched by using the fourth insulating film 106 as a mask, as is the case with the step shown in FIG. 6M, whereby the contact hole CH2 is formed in the active area. Here, in each of the terminal areas of the S terminal 314, the G terminal 324, and the B terminal 334 in the present modification example, as shown in FIG. 12B, the p-type amorphous semiconductor layer 153, the intrinsic amorphous semiconductor layer 152, and the first insulating film 103 are partially etched by the etching of the third insulating film 105 shown in FIG. 12A. As a result, the semiconductor layer 1504 including parts of the n-type amorphous semiconductor layer 151 and the intrinsic amorphous semiconductor layer 152 is formed. The lower electrode layer 1403*a* formed by lamination of ITO is not etched by the dry etching of the third insulating film 105, but portions that are not covered with lower electrode layer 1403*a* are etched.

Thereafter, steps identical to those shown in FIGS. 6N to 6T are carried out so that the fifth insulating film 107 in the terminal area is patterned, whereby the S terminal 314, the G terminal 324, and the B terminal 334 of the present modification example (see FIG. 11) are formed.

A structure of the terminal having a greater thickness has higher reliability. In the present modification example, no upper electrode layer is provided on the semiconductor layer 1503, but the gate layer 110 is provided in a layer lower than the source layer 100. In other words, as compared with Embodiment 3, a connection part of the gate layer 110, the lower electrode layer 1403*a*, and the conductive film 1703 is provided in a lower layer, which makes it more unlikely that the connection part would be influenced by scars and the like that occur when the imaging panel is produced.

Embodiments of the present invention are thus described above, but the above-described embodiments are merely examples for implementing the present invention. The present invention is not limited to the above-described embodiments, and can be appropriately modified and implemented without departing from the scope of the invention.

(1) Embodiments 1 to 3 described above are described with reference to an exemplary configuration in which the G terminal the S terminal, and the B terminal are provided with a lower electrode layer, but the lower electrode layer does not have to be provided. In a case where these terminals are not provided with a lower electrode layer, the metal film 140 may be patterned after the step shown in FIG. 6F so that the lower electrode 14a is formed in the active area, and the metal film 140 in the G terminal area and the SB terminal area may be removed.

(2) In the G terminal area and the SB terminal area in the configurations other than that of the modification example of Embodiment 3, the semiconductor layers 1501 to 1503 composed of the n-type amorphous semiconductor layer 151, the intrinsic amorphous semiconductor layer 152, and the p-type amorphous semiconductor layer 153 are formed, whereas in the modification example of Embodiment 3, the semiconductor layer 1504 composed of the n-type amorphous semiconductor layer 151 and the intrinsic amorphous semiconductor layer 152 is formed in the terminal area. In other words, at least a semiconductor layer made of the same material as that of the semiconductor layer of at least a part of the n-type amorphous semiconductor layer 151, intrinsic amorphous semiconductor layer 152, and p-type amorphous semiconductor layer 153 that compose the photoelectric conversion layer 15 may be formed in the G terminal area and the SB terminal area.

The invention claimed is:

1. An imaging panel that generates an image based on scintillation light that is obtained from X-rays transmitted through an object,
the imaging panel comprising;
a substrate having an active area and a terminal area on the substrate,
the imaging panel further comprising, in the active area:
a thin film transistor formed on the substrate;
a first insulating film provided on the thin film transistor;
a photoelectric conversion element provided on the first insulating film, the photoelectric conversion element including a first semiconductor layer of a first conductive type, an intrinsic amorphous semiconductor layer, and a second semiconductor layer of a second conductive type that is opposite to the first conductive type, as a photoelectric conversion layer that converts the scintillation light into charges;
a second insulating film separated in a layer above the photoelectric conversion element so as to have a contact hole; and
a conductive film that is connected with the photoelectric conversion element through the contact hole,
the imaging panel further comprising, in the terminal area:
a first conductive layer provided on the substrate, the first conductive layer being made of the same material as that of a gate electrode or a source electrode of the thin film transistor;
a terminal-first insulating film that is made of the same material as that of the first insulating film, and is separated on a part of the first conductive layer so as to have an opening;
a terminal-semiconductor layer that is provided above the terminal-first insulating film, and is made of the same material as that of at least a part of the semiconductor layers of the photoelectric conversion layer; and
a second conductive layer that is made of the same material as that of the conductive film, and is provided on the terminal-semiconductor layer so as to be in contact with the first conductive layer in the opening.

2. The imaging panel according to claim 1,
wherein the photoelectric conversion element includes a lower electrode provided under the photoelectric conversion layer, and an upper electrode provided on the photoelectric conversion layer, and
the conductive film is connected with the upper electrode, the imaging panel further comprising, in the terminal area, an upper electrode layer that is provided on the terminal-semiconductor layer, and is made of the same material as that of the upper electrode in contact with the second conductive layer.

3. The imaging panel according to claim 2, further comprising, in the terminal area, a lower electrode layer that is made of the same material as that of the lower electrode, is provided under the terminal-semiconductor layer, and is in contact with the first conductive layer and the second conductive layer in the opening.

4. The imaging panel according to claim 2,
wherein a lateral side end of the upper electrode layer is arranged inside with respect to a lateral side end of the semiconductor layer.

5. The imaging panel according to claim 4,
wherein the semiconductor layer has such a tapered shape that a bottom of the semiconductor layer is arranged outside with respect to an upper part of the semiconductor layer.

6. The imaging panel according to claim 1, further comprising:
in the active area, a third insulating film that is provided on the second insulating film and covers the conductive film; and
in the terminal area, a terminal-second insulating film that is made of the same material as that of the third insulating film, and in an area excluding the opening, covers at least a part of the terminal-first insulating film and the terminal-semiconductor layer.

7. A method for producing an imaging panel that generates an image based on scintillation light that is obtained from X-rays transmitted through an object, the method comprising the steps of:
forming a thin film transistor in an active area on a substrate, and at the same time, forming a first conductive layer made of the same material as that of a gate electrode or a source electrode of the thin film transistor, in a terminal area on the substrate;
forming a first insulating film on the thin film transistor, and at the same time, forming a terminal-first insulating film that is made of the same material as that of the first insulating film, and is arranged so as to have an opening on a part of the first conductive layer;
forming, on the drain electrode of the thin film transistor, a first contact hole passing through the first insulating film, and forming, on the first insulating film, a lower electrode that is connected with the drain electrode through the first contact hole;
forming, on the lower electrode, a photoelectric conversion layer composed of a first semiconductor layer of a first conductive type, an intrinsic amorphous semiconductor layer, and a second semiconductor layer of a second conductive type that is opposite to the first conductive type, forming an upper electrode on the photoelectric conversion layer, and at the same time, forming, above the terminal-first insulating film, in an area excluding the opening, a terminal-semiconductor layer that is made of the same material as that of at least a part of the semiconductor layers in the photoelectric conversion layer;
forming a second insulating film on the upper electrode and the terminal-semiconductor layer, and forming a resin layer on the second insulating film in the active area, the resin layer having an opening on the upper electrode;

forming a second contact hole that passes through the second insulating film at a position where the opening of the resin layer is provided, by using the resin layer in the active area as a mask, and at the same time, removing the second insulating film provided on the terminal-semiconductor layer; and forming a conductive film in on the resin layer in the active area so that the conductive film is connected with the upper electrode through the second contact hole, and at the same time, forming, on the terminal-semiconductor layer, a second conductive film that is made of the same material as that of the conductive film so that the second conductive film is in contact with the first conductive film at the opening.

* * * * *